(12) United States Patent
Tanaka et al.

(10) Patent No.: US 11,064,598 B2
(45) Date of Patent: Jul. 13, 2021

(54) STATIC ELIMINATOR AND STATIC ELIMINATING METHOD

(71) Applicant: SCREEN Holdings Co., Ltd., Kyoto (JP)

(72) Inventors: Takayoshi Tanaka, Kyoto (JP); Seiji Ano, Kyoto (JP)

(73) Assignee: SCREEN Holdings CO., Ltd., Kyoto (JP)

( * ) Notice: Subject to any disclaimer, the term of this patent is extended or adjusted under 35 U.S.C. 154(b) by 610 days.

(21) Appl. No.: 15/844,882

(22) Filed: Dec. 18, 2017

(65) Prior Publication Data

US 2018/0184508 A1    Jun. 28, 2018

(30) Foreign Application Priority Data

Dec. 28, 2016  (JP) .............................. JP2016-255282

(51) Int. Cl.
| | |
|---|---|
| *H05F 3/04* | (2006.01) |
| *H01T 19/04* | (2006.01) |
| *H01T 23/00* | (2006.01) |
| *H01L 21/67* | (2006.01) |

(52) U.S. Cl.
CPC .......... *H05F 3/04* (2013.01); *H01L 21/67115* (2013.01); *H01L 21/67248* (2013.01); *H01T 19/04* (2013.01); *H01T 23/00* (2013.01)

(58) Field of Classification Search
CPC ......... H01L 21/02046; H01L 21/02057; H01L 21/2686; H01L 21/3105; H01L 21/67017; H01L 21/67028; H01L 21/67034; H01L 21/67109; H01L 21/67115; H01L 21/67173; H01L 21/6719; H01L 21/67248; H01L 21/67703; H01L 21/67748; H01L 21/68742; H01L 21/68764;

(Continued)

(56) References Cited

U.S. PATENT DOCUMENTS

| 5,316,970 A | * | 5/1994 | Batchelder ........ H01L 21/67028 |
| | | | 250/423 P |
| 5,465,447 A | | 11/1995 | Itoh et al. |
| 5,795,401 A | | 8/1998 | Itoh et al. |

(Continued)

FOREIGN PATENT DOCUMENTS

| CN | 101904226 A | 12/2010 |
| CN | 102051597 A | 5/2011 |

(Continued)

OTHER PUBLICATIONS

Office Action dated Jun. 30, 2020 in counterpart Japanese Patent Application No. 2016-255282 (Year: 2020).*

(Continued)

*Primary Examiner* — Jared Fureman
*Assistant Examiner* — Nicolas Bellido
(74) *Attorney, Agent, or Firm* — Ostrolenk Faber LLP

(57) ABSTRACT

A static eliminator performs processing of reducing the charge amount of an electrically charged substrate. The static eliminator includes a substrate holder and an ultraviolet irradiator. The substrate holder holds the substrate. The ultraviolet irradiator is capable of irradiating a main surface of the substrate with ultraviolet light in an irradiation amount that differs between a plurality of divided regions of the main surface of the substrate.

18 Claims, 19 Drawing Sheets

(58) Field of Classification Search
CPC ... H01L 21/76825; H01L 22/12; H01T 19/04; H01T 23/00; H02N 13/00; H05F 3/04
See application file for complete search history.

(56) References Cited

U.S. PATENT DOCUMENTS

| | | | |
|---|---|---|---|
| 7,598,489 B2 | 10/2009 | Miller et al. | |
| 7,663,121 B2* | 2/2010 | Nowak | B05D 3/0209 250/453.11 |
| 8,730,641 B2 | 5/2014 | Fukada | 361/213 |
| 9,105,446 B2* | 8/2015 | Ebizuka | H01J 37/226 |
| 2005/0263719 A1* | 12/2005 | Ohdaira | C23C 16/56 250/492.1 |
| 2006/0165904 A1* | 7/2006 | Ohara | H01L 21/67115 427/372.2 |
| 2006/0249078 A1* | 11/2006 | Nowak | B05D 3/067 118/724 |
| 2007/0188970 A1 | 8/2007 | Inaba et al. | |
| 2008/0017114 A1* | 1/2008 | Watanabe | H01L 21/67115 118/725 |
| 2008/0023639 A1* | 1/2008 | Kawasaki | H01L 21/67115 250/372 |
| 2009/0026171 A1 | 1/2009 | Ito | |
| 2009/0093135 A1* | 4/2009 | Matsushita | H01L 21/67115 438/798 |
| 2010/0096534 A1* | 4/2010 | Gharagozloo | G01J 1/02 250/205 |
| 2011/0104395 A1 | 5/2011 | Kumagai et al. | |
| 2011/0168924 A1 | 7/2011 | Jendrejack et al. | |
| 2011/0204228 A1* | 8/2011 | Tsuno | H01J 37/224 250/310 |
| 2012/0187083 A1* | 7/2012 | Hashizume | B05C 11/00 216/37 |
| 2014/0311676 A1 | 10/2014 | Hatoh et al. | |
| 2015/0097123 A1* | 4/2015 | Ebizuka | H02N 13/00 250/440.11 |
| 2018/0286706 A1* | 10/2018 | Tanaka | H01L 21/68764 |

FOREIGN PATENT DOCUMENTS

| | | |
|---|---|---|
| CN | 103427010 A | 12/2013 |
| CN | 104094376 A | 10/2014 |
| JP | S62-44995 A | 2/1987 |
| JP | 11-329783 A | 11/1999 |
| JP | 2000-340925 A | 12/2000 |
| JP | 2001-293443 A | 10/2001 |
| JP | 2001293443 A * | 10/2001 |
| JP | 2003-142570 A | 5/2003 |
| JP | 2009-158375 A | 7/2009 |
| JP | 2012-186148 A | 9/2012 |
| KR | 10-2014-0119080 A | 10/2014 |
| TW | 253977 | 8/1995 |
| TW | 201349336 A | 12/2013 |

OTHER PUBLICATIONS

Decision of Grant dated Sep. 8, 2020 in counterpart Japanese Patent Application No. 2016-255282 (Year: 2020).*
Office Action dated Feb. 28, 2019 in counterpart Korean Patent Application No. 10-2017-0177188 with Japanese translation and English translation based on the Japanese translation. Portions relevant to prior-art based rejections are translated.
Notice of Final Rejection dated Sep. 30, 2019 in counterpart Korean Patent Application No. 10-2017-0177188 with English translation obtained from One Portal Dossier.
First Office Action dated Sep. 10, 2019 and Search Report in counterpart Chinese Patent Application No. 201711420309.6 with English translation obtained from One Portal Dossier.
Office Action dated Jan. 23, 2019 and Search Report in counterpart Taiwanese Patent Application No. 106142691 with Japanese translation and English translation based on the Japanese translation. Portions relevant to prior-art based rejections are translated.
Second Office Action dated May 18, 2020 and Search Report in corresponding Chinese Patent Application No. 201711420309.6 with English translation obtained from the Japanese Patent Office.

* cited by examiner

STATIC ELIMINATOR AND STATIC ELIMINATING METHOD

BACKGROUND OF THE INVENTION

Field of the Invention

The present invention relates to a static eliminator and a static eliminating method.

Description of the Background Art

In a conventional process of manufacturing a semiconductor substrate (hereinafter simply referred to as a "substrate"), a substrate processing device has been used to perform various kinds of processing on the substrate provided with an insulating film such as an oxide film. For example, a substrate having a surface on which a resist is patterned is supplied with processing liquid and is subjected to processing such as etching on the surface thereof. In addition, processing to remove the resist on the substrate is performed after the etching or the like ends.

Before conveyed into the substrate processing device, a substrate to be processed by the substrate processing device is subjected to dry processing such as dry etching and plasma chemical vapor deposition (CVD). In such dry processing, electric charge is generated in the device, and the substrate is conveyed into the substrate processing device while being electrically charged (what is called carried-in electrical charging). Then, when processing liquid such as SPM liquid having a low specific resistance is supplied on the substrate in the substrate processing device, the electric charge in the device abruptly moves from the device to the processing liquid (in other words, discharges into the processing liquid), potentially causing damage on the device due to heat generated along with the movement.

To avoid this, a static eliminator has been conventionally used (for example, Japanese Patent Application Laid-Open No. 2012-186148). The static eliminator includes a pair of discharge needles. The static eliminator applies voltage to the pair of discharge needles to generate ions, and supplies air containing the ions to a static eliminating target. The static eliminator includes a surface electrometer configured to measure the surface potential at one place on the static eliminating target. The static eliminator controls voltage applied to the pair of discharge needles based on the surface potential at one place. In this manner, air containing appropriate ions in accordance with the surface potential can be supplied to the static eliminating target.

Another conventionally used static eliminator generates ultraviolet light. This static eliminator performs static eliminating processing by irradiating a substrate with ultraviolet light.

Examples of technologies related to the present invention include Japanese Patent Application Laid-Open No. 2009-158375 and Japanese Patent Application Laid-Open No. 11-329783.

FIG. 28 is a diagram schematically illustrating exemplary surface potential distribution at a main surface of a substrate. FIG. 28 illustrates surface potential distribution V1 before ultraviolet irradiation, surface potential distribution V2 after ultraviolet irradiation, and average distribution V3 of the distribution V2. FIG. 29 is a diagram schematically illustrating exemplary surface potential temporal change near the center of the main surface of the substrate.

In the example illustrated in FIGS. 28 and 29, the surface potential takes a negative value before ultraviolet irradiation. This indicates that negative electric charge accumulates on the main surface of the substrate. In the distribution V1 before ultraviolet irradiation, the surface potential is lower near the center of the main surface of the substrate and higher at a position closer to the periphery thereof. Thus, the absolute value of the surface potential (hereinafter referred to as a charge amount) is larger near the center of the main surface of the substrate and smaller at a position closer to the periphery thereof. The surface potential distribution V1 has a dish shape.

As the main surface of the substrate is irradiated with ultraviolet light, the surface potential increases with time (the charge amount decreases). In other words, electric charge is removed. Accordingly, as illustrated in FIG. 28, the surface potential after ultraviolet irradiation takes a positive or negative value, depending on the position on the main surface. Specifically, the surface potential distribution V3 (white rectangles) takes a negative value near the periphery of the main surface of the substrate and a positive value near the center. This indicates that the main surface of the substrate is positively charged near the center.

Thus, when the main surface of the substrate is uniformly irradiated with ultraviolet light, the surface potential at the main surface of the substrate does not converge to zero, but negative electric charge remains and positive electric charge accumulates at some positions on the main surface of the substrate. As a result, the surface potential could not be uniformly reduced across the entire region of the main surface of the substrate by uniformly irradiating the main surface of the substrate with ultraviolet light. Such a phenomenon had not been conventionally known, but was observed for the first time by the applicant of the present application.

SUMMARY OF THE INVENTION

The present invention is directed to a static eliminator configured to perform processing of removing electric charge from a substrate.

A first aspect is a static eliminator configured to perform processing of removing electric charge from a substrate. The static eliminator includes a substrate holder and an ultraviolet irradiator. The substrate holder holds the substrate. The ultraviolet irradiator irradiates a plurality of divided regions of a main surface of the substrate with ultraviolet light in an irradiation amount that mutually differs between the plurality of regions of the substrate.

According to the static eliminator and a static eliminating method, the amount of electric charge stored on the main surface of the substrate can be reduced appropriately in accordance with the regions of the main surface.

A second aspect is the static eliminator according to the first aspect, in which the irradiation amount of ultraviolet light from the ultraviolet irradiator to the plurality of regions is variable. The static eliminator further includes a plurality of surface potential meters and an irradiation amount controller. The plurality of surface potential meters measure surface potentials in the plurality of respective regions. The irradiation amount controller controls the irradiation amounts in the plurality of respective regions in accordance with the surface potentials measured by the plurality of surface potential meters.

A third aspect is the static eliminator according to the first or second aspect, in which the ultraviolet irradiator includes a plurality of unit irradiators. The plurality of unit irradiators irradiates the plurality of respective regions with ultraviolet light.

A fourth aspect is the static eliminator according to the second aspect, further including an ultraviolet controller configured to control the ultraviolet irradiator. The ultraviolet irradiator includes a plurality of unit irradiators. The plurality of unit irradiators irradiates the plurality of respective regions with ultraviolet light. The plurality of surface potential meters each measure a surface potential at the main surface of the substrate during the ultraviolet irradiation by the ultraviolet irradiator. The ultraviolet controller determines whether an absolute value of the surface potential in one of the plurality of regions measured by one of the plurality of surface potential meters is smaller than a reference value. The ultraviolet controller stops a unit irradiator corresponding to the one of the plurality of regions among the plurality of unit irradiators, when having determined the absolute value of the surface potential in the one of the plurality of regions is smaller than the reference value.

A fifth aspect is the static eliminator according to the third or fourth aspect, in which the plurality of unit irradiators have arc or ring shapes having mutually different radii and are concentrically arranged.

A sixth aspect is the static eliminator according to the third or fourth aspect, further including a rotation mechanism. The rotation mechanism rotates the substrate holder about a rotational axis orthogonal to the main surface of the substrate. The plurality of unit irradiators each have a bar shape extending in a first direction parallel to the main surface of the substrate and are arranged side by side in a second direction parallel to the main surface of the substrate and orthogonal to the first direction.

A seventh aspect is the static eliminator according to any one of the third to sixth aspects, further including a switching controller. The switching controller controls the irradiation amount of ultraviolet light in each of the plurality of regions by performing switching between execution and stop of ultraviolet irradiation by each of the plurality of unit irradiators.

An eighth aspect is the static eliminator according to any one of the third to seventh aspects, further including an intensity controller. The intensity controller controls the plurality of unit irradiators to control an intensity of ultraviolet light emitted by each of the plurality of unit irradiators.

A ninth aspect is the static eliminator according to the second aspect, further including a first movement mechanism, a rotation mechanism, and a speed controller. The first movement mechanism relatively moves the ultraviolet irradiator and the substrate holder in a direction along the main surface of the substrate. The rotation mechanism rotates the substrate holder about a rotational axis orthogonal to the main surface of the substrate. The speed controller controls the first movement mechanism to control a pattern of a relative moving speed between the ultraviolet irradiator and the substrate holder based on the surface potentials measured by the plurality of surface potential meters.

A tenth aspect is the static eliminator according to the ninth aspect, further including a second movement mechanism. The second movement mechanism relatively moves the plurality of surface potential meters and the substrate holder between a position at which the plurality of surface potential meters face to the main surface of the substrate and a position at which the plurality of surface potential meters do not face to the main surface of the substrate.

An eleventh aspect is a static eliminating method of reducing a charge amount of an electrically charged substrate. The static eliminating method includes a first process and a second process. In the first process, the substrate is placed on a substrate holder. In the second process, an ultraviolet irradiator irradiates a plurality of divided regions of a main surface of the substrate with ultraviolet light in an irradiation amount that differs between the plurality of regions of the substrate.

A twelfth aspect is the static eliminating method according to the eleventh aspect, in which the second process includes: a process of starting irradiation of the plurality of regions with ultraviolet light by a plurality of respective unit irradiators included in the ultraviolet irradiator; a process of measuring, by each of a plurality of surface potential meters, a surface potential at the main surface of the substrate during the ultraviolet irradiation by the ultraviolet irradiator; a process of determining whether an absolute value of the surface potential in one of the plurality of regions measured by one of the plurality of surface potential meters is smaller than a reference value; and a process of stopping a unit irradiator corresponding to the one of the plurality of regions among the plurality of unit irradiators, when having determined that the absolute value of the surface potential in the one of the plurality of regions is smaller than the reference value.

A thirteenth aspect is the static eliminating method according to the eleventh aspect, in which the ultraviolet irradiator includes a plurality of unit irradiators. The plurality of unit irradiators irradiate the plurality of respective regions with ultraviolet light.

A fourteenth aspect is the static eliminating method according to the thirteenth aspect, in which the plurality of unit irradiators have arc or ring shapes having mutually different radii and are concentrically arranged.

A fifteenth aspect is the static eliminating method according to the thirteenth aspect, in which the plurality of unit irradiators each have a bar shape extending in a first direction parallel to the main surface of the substrate and are arranged side by side in a second direction parallel to the main surface of the substrate and orthogonal to the first direction. In the second process, the substrate holder is rotated about a rotational axis orthogonal to the main surface of the substrate.

A sixteenth aspect is the static eliminating method according to the thirteenth aspect, in which, in the second process, the irradiation amount of ultraviolet light in each of the plurality of regions is controlled by performing switching between execution and stop of ultraviolet irradiation by each of the plurality of unit irradiators.

A seventeenth aspect is the static eliminating method according to the thirteenth aspect, in which, in the second process, the plurality of unit irradiators are controlled to control an intensity of ultraviolet light emitted by each of the plurality of unit irradiators.

An eighteenth aspect is the static eliminating method according to the eleventh aspect, in which the second process includes: a process of measuring, by each of a plurality of surface potential meters, a surface potential at the main surface of the substrate during the ultraviolet irradiation by the ultraviolet irradiator; a process of starting irradiation of the plurality of regions with ultraviolet light by a plurality of respective unit irradiators included in the ultraviolet irradiator; and a process of relatively moving the ultraviolet irradiator and the substrate holder in a direction along the main surface of the substrate in a pattern of a moving speed controlled based on the surface potential measured by each of the plurality of surface potential meters while rotating the substrate holder about a rotational axis orthogonal to the main surface of the substrate.

A nineteenth aspect is the static eliminating method according to the eighteenth aspect, in which the second process further includes a process of relatively moving the plurality of surface potential meters and the substrate holder between a position at which the plurality of surface potential meters face to the main surface of the substrate and a position at which the plurality of surface potential meters do not face to the main surface of the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described in detail below with reference to the accompanying drawings.

First Preferred Embodiment

<Exemplary Entire Configuration of Substrate Processing System>

Figure 1:
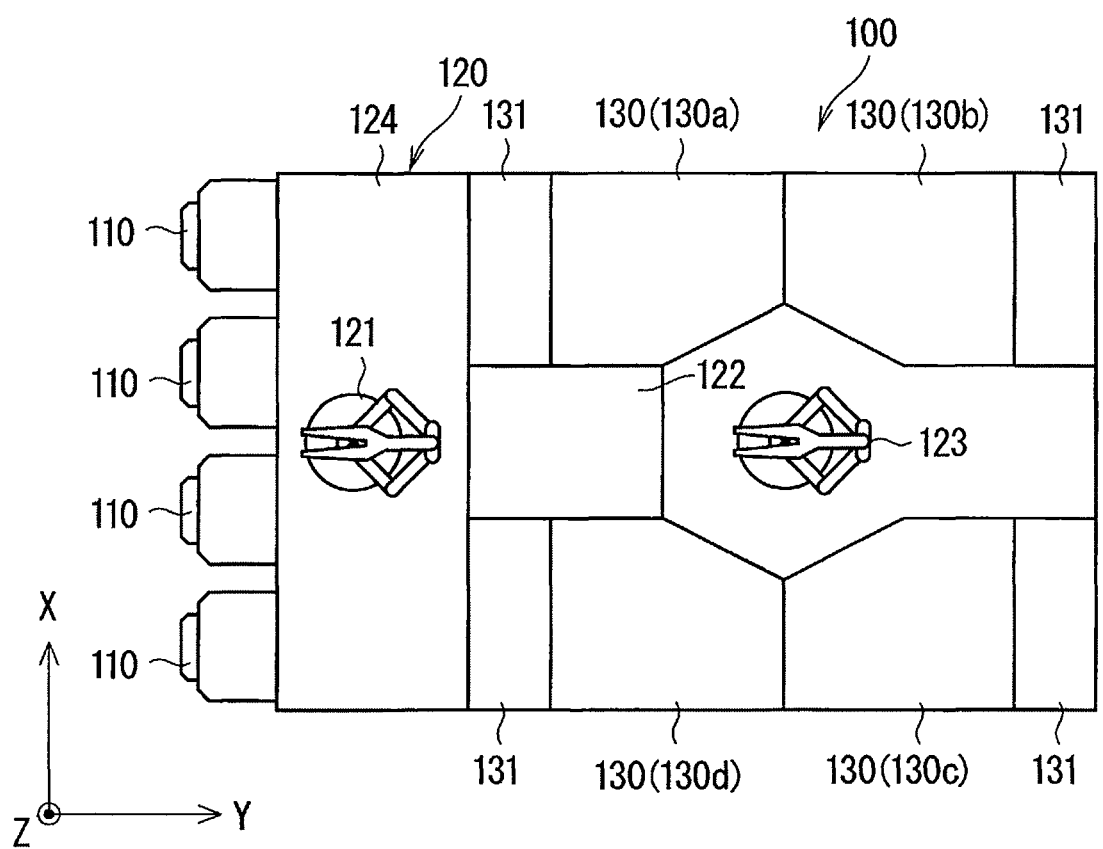
FIG. 1 is a diagram schematically illustrating an exemplary configuration of a substrate processing system.

FIG. 1 is a diagram schematically illustrating an exemplary entire configuration of a substrate processing system 100. The size of each component and the number thereof in FIG. 1 or any other subsequent drawing are exaggerated or simplified as necessary to facilitate understanding.

The substrate processing system 100 is a device configured to perform various kinds of processing on a semiconductor substrate. The substrate processing system 100 includes, for example, a container holder 110, a substrate passing unit 120, and a substrate processing unit 130. The container holder 110 holds a substrate container. The substrate container houses, for example, a plurality of substrates. In the example illustrated in FIG. 1, a plurality of the container holders 110 are arrayed in a one direction (hereinafter also referred to as an X direction) parallel to a horizontal plane.

The substrate processing unit 130 is a device configured to perform predetermined processing on the substrate. In the example illustrated in FIG. 1, a plurality of the substrate processing units 130 (in the illustrated example, substrate processing units 130a to 130d) are provided. The substrate processing units 130a to 130d each perform various kinds of processing on the substrate. For the purpose of illustration, it is assumed that the substrate receives processing through the substrate processing units 130a to 130d in this order. For example, the substrate processing unit 130a supplies the substrate with processing liquid (processing liquid such as chemical, rinse liquid, or isopropyl alcohol (IPA) liquid). Accordingly, processing in accordance with the processing liquid is performed on the substrate. It is not preferable for later processing at the substrate processing unit 130c that electric charge is accumulated on the substrate. Some organic substances remain as impurities on a main surface of the substrate through processing (for example, processing using IPA) by the substrate processing unit 130b, and thus are desirably removed.

The substrate passing unit 120 is positioned between the container holders 110 and the substrate processing units 130a to 130d. A substrate yet to be processed is passed from the container holders 110 to the substrate processing unit 130a through the substrate passing unit 120. Having processed at the substrate processing unit 130a, the substrate is passed from the substrate processing unit 130a to the container holders 110 or the substrate processing unit 130b through the substrate passing unit 120. Temporally sequential conveyance of the substrate between the substrate processing units 130b to 130d is performed in the same manner.

The substrate passing unit 120 includes, for example, an indexer robot 121, a passing unit 122, and a conveyance robot 123. The indexer robot 121 can be reciprocated through an indexer conveyance path 124 to be described next in the X direction. The indexer conveyance path 124 extends in the X direction side by side with the plurality of container holders 110. The indexer robot 121 can stop at positions facing to the respective container holders 110 in the indexer conveyance path 124.

The indexer robot 121 includes, for example, an arm and a hand. The hand is provided at a leading end of the arm and capable of holding a substrate and releasing the held substrate. The hand can be reciprocated in a direction (hereinafter also referred to as a Y direction) parallel to a horizontal plane and vertical to the X direction by driving the arm. While facing to any of the container holders 110, the indexer robot 121 can move the hand to the container holder 110 to take a substrate yet to be processed out of the container holders 110, or can pass a processed substrate to the container holder 110.

The passing unit 122 is positioned on a side opposite to the container holders 110 with respect to the indexer conveyance path 124. For example, the passing unit 122 may be disposed at a position facing to a central part of the indexer conveyance path 124 in the X direction. For example, the passing unit 122 may include a placement table or rack on which a substrate is to be placed. The indexer robot 121 can rotate the arm in a horizontal plane by 180°. In this manner, the indexer robot 121 can move the hand to the passing unit 122. The indexer robot 121 can pass a substrate taken out of the container holders 110 to the passing unit 122 or take a substrate placed at the passing unit 122 out of the passing unit 122.

The conveyance robot 123 is provided on a side opposite to the indexer conveyance path 124 with reference to the passing unit 122. The plurality of (in FIG. 1, four) the substrate processing units 130 are disposed surrounding the conveyance robot 123. In the example illustrated in FIG. 1, fluid boxes 131 are provided adjacent to the respective substrate processing units 130. Each fluid box 131 can supply processing liquid to the adjacent substrate processing unit 130 or collect used processing liquid from the substrate processing unit 130.

Similarly to the indexer robot 121, the conveyance robot 123 includes an arm and a hand. The conveyance robot 123 can take a substrate out of the passing unit 122 or pass a substrate to the passing unit 122. The conveyance robot 123 can pass a substrate to each substrate processing unit 130 or take the substrate out of the substrate processing unit 130. The indexer robot 121 and the conveyance robot 123 can be each regarded as a conveying means for conveying a substrate.

This configuration allows execution of schematic operation as follows. Specifically, semiconductor substrates housed in the respective container holders 110 are sequentially conveyed to the passing unit 122 by the indexer robot 121. Then, the substrates are sequentially conveyed to the substrate processing units 130a to 130d by the conveyance robot 123 to receive processing at the substrate processing units 130a to 130d. Having been subjected to this series of processing, the substrates are returned to the container holders 110 through the passing unit 122 and the indexer robot 121.

<Static Eliminator>

Figure 2:
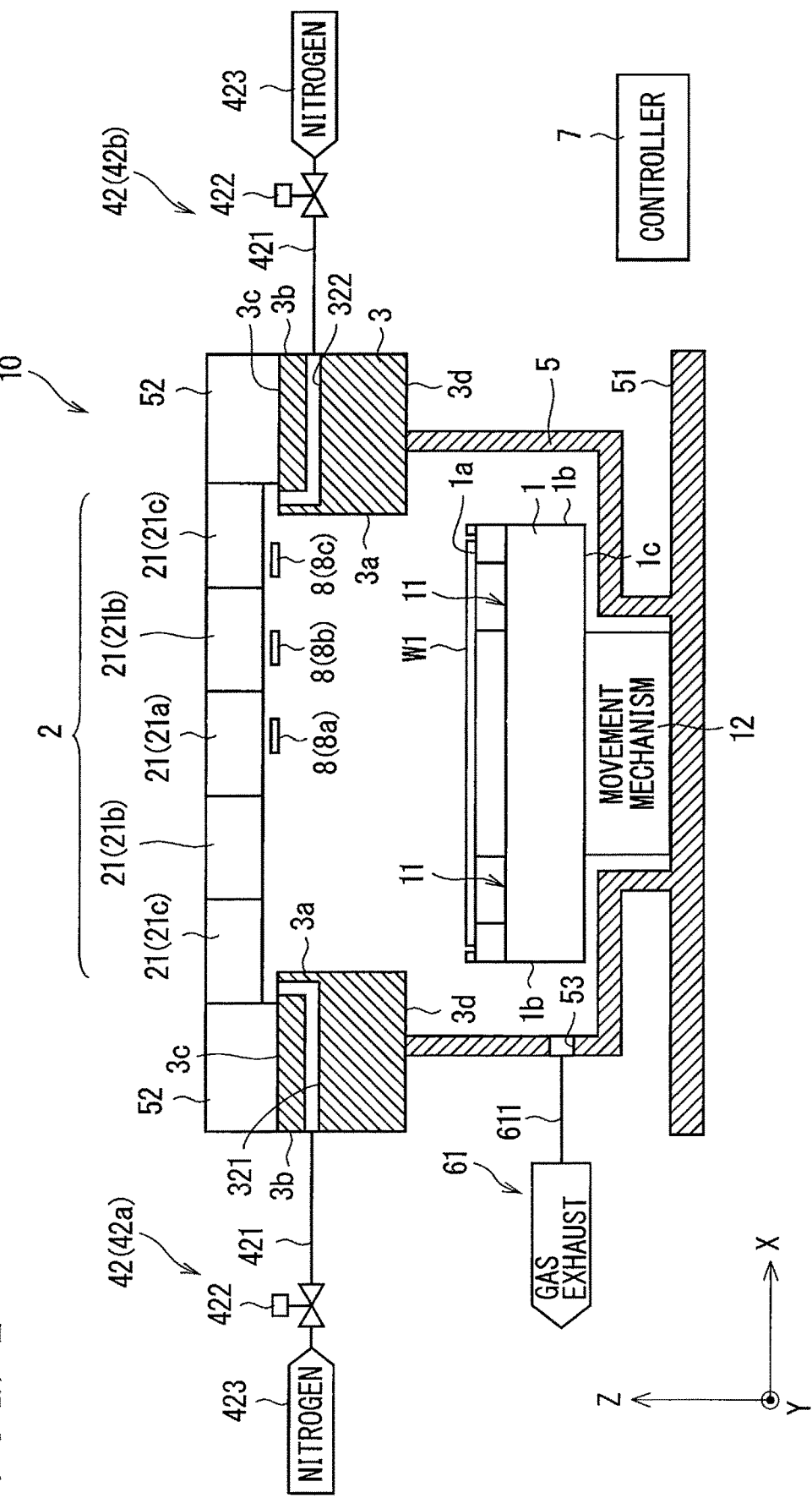
FIG. 2 is a diagram schematically illustrating an exemplary configuration of a static eliminator.
Figure 3:
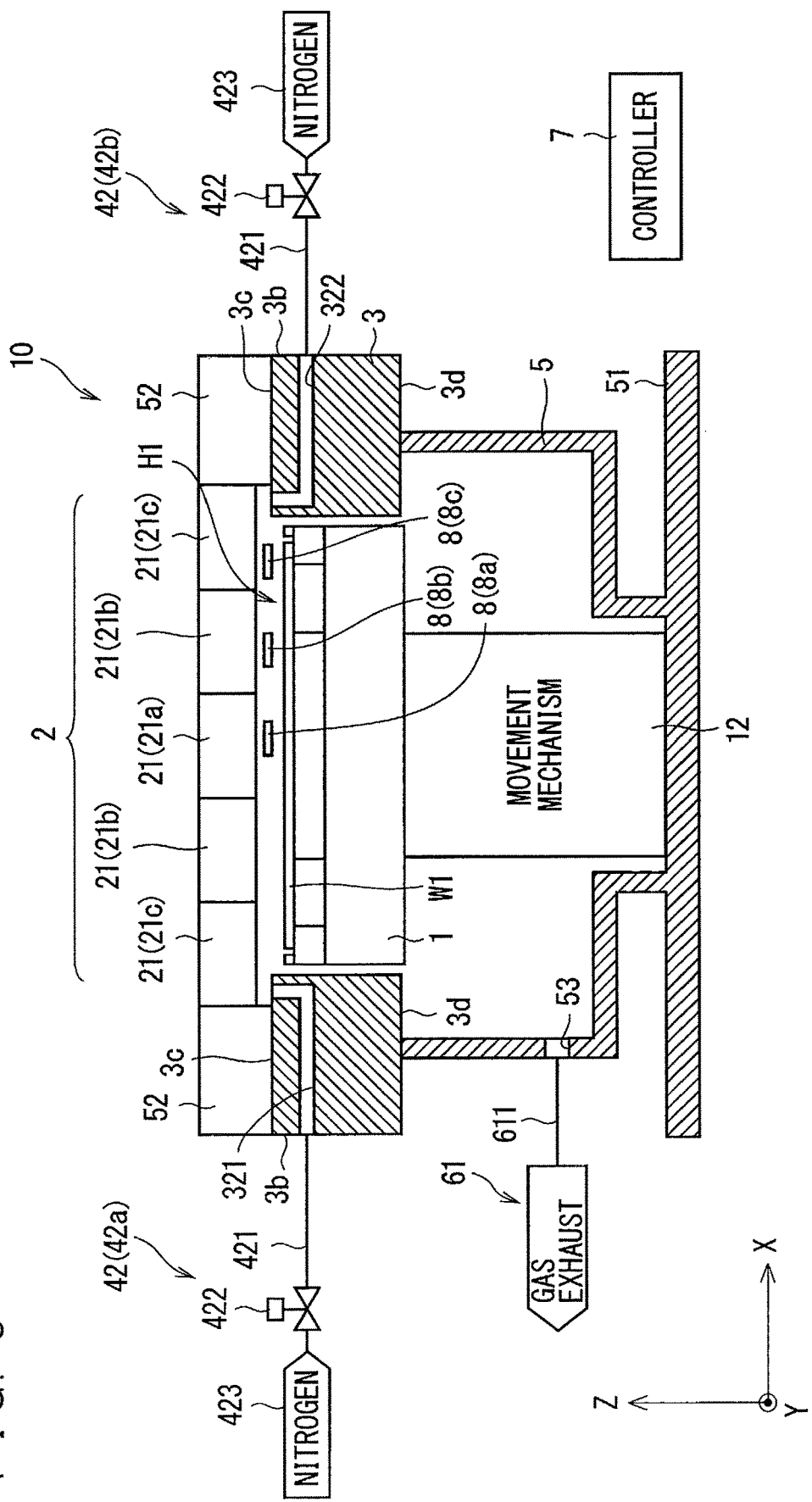
FIG. 3 is a diagram schematically illustrating the exemplary configuration of the static eliminator.

FIGS. 2 and 3 are each a diagram schematically illustrating an exemplary configuration of a static eliminator 10. The static eliminator 10 may be provided to, for example, the passing unit 122. FIGS. 2 and 3 each illustrate an exemplary configuration of a section orthogonal to, for example, the Y direction. The static eliminator 10 does not necessarily need to be provided to the passing unit 122, but may be provided as, for example, the substrate processing unit 130d. In other words, the static eliminator 10 may be provided as a part of the plurality of substrate processing units 130.

The static eliminator 10 includes a substrate holder 1, a movement mechanism 12, an ultraviolet irradiator 2, a surface potential meter 8, a tubular member 3, a gas supplying unit 42, a gas exhaust unit 61, and a controller 7.

<Substrate Holder>

The substrate holder 1 is a member configured to hold a substrate W1 horizontally. When the substrate W1 is a semiconductor substrate (in other words, a semiconductor wafer), the substrate W1 has a substantially circular flat plate shape. The substrate holder 1 has a cylindrical shape including an upper surface 1a, a side surface 1b, and a lower surface 1c. The side surface 1b couples the periphery of the upper surface 1a with the periphery of the lower surface 1c. The substrate W1 is placed on the upper surface 1a of the substrate holder 1.

As exemplarily illustrated in FIGS. 2 and 3, a pair of grooves 11 are formed in the upper surface 1a. Hands of the indexer robot 121 or the conveyance robot 123 are inserted into the pair of grooves 11.

The substrate W1 is placed on the substrate holder 1 as described below. Specifically, the substrate W1 is conveyed to a position above the substrate holder 1 while being placed on the hands. Subsequently, the hands move toward the substrate holder 1 from above. Along with this movement, the hands are inserted into the pair of grooves 11 from above. Through the movement, the substrate W1 is placed on the substrate holder 1 and separated from the hands. Thereafter, the indexer robot 121 or the conveyance robot 123 moves the hands in the Y direction to remove the hands from inside the grooves 11. In this manner, the substrate W1 is placed on the substrate holder 1.

The upper surface 1a of the substrate holder 1 may be provided with, in regions different from the grooves 11, a plurality of protrusion shapes (hereinafter referred to as protrusions) protruding toward the substrate W1. The protrusions are also referred to as pins. The protrusions each have, for example, a cylinder shape. When the protrusions are provided, the substrate W1 is supported by leading ends of the protrusions.

<Ultraviolet Irradiator>

The ultraviolet irradiator 2 is disposed on an upper side (side opposite to the substrate holder 1) of the substrate W1. Thus, the ultraviolet irradiator 2, the substrate W1, and the substrate holder 1 are arranged in this order in a Z direction. The ultraviolet irradiator 2 can generate ultraviolet light and irradiate a main surface (main surface opposite to the substrate holder 1) of the substrate W1 with the ultraviolet light. The ultraviolet irradiator 2 can irradiate the main surface of the substrate W1 with ultraviolet light in an irradiation amount that mutually differs between a plurality of regions of the main surface of the substrate W1. The plurality of regions, which are exemplarily described in detail later, is obtained by dividing the main surface of the substrate W1 in plan view. Thus, the set of the plurality of regions matches and covers the main surface. The irradiation amount is the time integral of the intensity of ultraviolet light. Accordingly, the irradiation amount increases with an irradiation time and the intensity of ultraviolet light.

Figure 4:
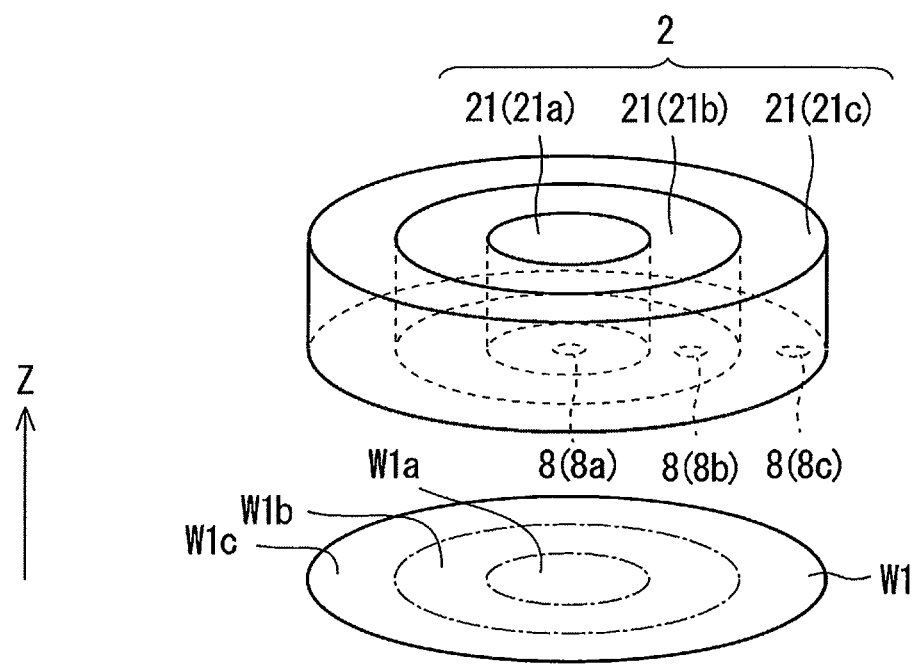
FIG. 4 is a diagram schematically illustrating an exemplary configured of a substrate and an ultraviolet irradiator.

FIG. 4 is a perspective view schematically illustrating an exemplary configuration of the ultraviolet irradiator 2. The ultraviolet irradiator 2 includes a plurality of unit irradiators 21 (in FIG. 4, unit irradiators 21a to 21c). The unit irradiator 21a has a circular shape in plan view in the Z direction, and the unit irradiators 21b and 21c have ring shapes in plan view seen along the Z direction. The inner diameter of the unit irradiator 21b is larger than the outer diameter of the unit irradiator 21a, and the inner diameter of the unit irradiator 21c is larger than the outer diameter of the unit irradiator 21b. The unit irradiators 21a to 21c are concentrically arranged. Specifically, the unit irradiator 21a is positioned on an inner periphery side of the unit irradiator 21b, and the unit irradiator 21b is positioned on an inner periphery side of the unit irradiator 21c. The unit irradiators 21a to 21c have central axes passing through the center of the substrate W1. The unit irradiator 21a, which has a circular shape in plan view, may have a ring shape.

The unit irradiators 21a to 21c face to the substrate W1 through a gap in the Z direction. Specifically, the unit irradiator 21a faces to a circular region W1a of the main surface of the substrate W1a round the center of the main surface, the unit irradiator 21b faces to a ring region W1b positioned outside of the region W1a on the main surface of the substrate W1 and having a predetermined width, and the unit irradiator 21c faces to a ring region W1c positioned outside of the region W1b on the main surface of the substrate W1. In this manner, the positions of the unit irradiators 21a to 21c correspond to the respective regions W1a to W1c.

The unit irradiators 21a to 21c mainly irradiate the respective regions W1a to W1c with ultraviolet light. The unit irradiator 21a irradiates the outside of the region W1a with ultraviolet light, but in the following, for simplification of description, it is assumed that the unit irradiator 21a only irradiates the region W1a with ultraviolet light. This assumption also applies to the unit irradiator 21b and 21c.

Each unit irradiator 21 is, for example, an excimer ultraviolet (UV) lamp. The unit irradiator 21 includes a quartz tube filled with, for example, electric discharge gas (for example, noble gas or noble-gas-halogen compound), and a pair of electrodes. The electric discharge gas exists between the pair of electrodes. High-frequency application of high voltage between the pair of electrodes excites the electric discharge gas into an excimer state. The electric discharge gas generates ultraviolet light when returning the excimer state to the ground state.

<Surface Potential Meter>

A plurality of surface potential meters 8 (in the example illustrated in FIGS. 2 to 4, surface potential meters 8a to 8c) measure surface potentials in the plurality of respective regions W1a to W1c. Thus, the surface potential meters 8a to 8c are provided at positions corresponding to the respective regions W1a to W1c. Each surface potential meter 8 is, for example, a non-contact surface electrometer disposed between the ultraviolet irradiator 2 and the substrate W1. For example, the surface potential meter 8 includes a probe. The probe includes an electrode. At measurement, the distance between a leading end of the probe and the main surface of the substrate W1 is set to be several millimeters (for example, 5 mm) or smaller approximately. Each surface potential meter 8 measures the surface potential at a part facing to the probe based on a voltage occurring at the electrode of the probe.

In the example illustrated in FIGS. 2 to 4, the surface potential meter 8a is disposed at a position facing to the center of the region W1a in the Z direction, and measures the surface potential at the center. The surface potential meter 8b is disposed at a position facing to a first measurement target part inside the region W1b in the Z direction, and measures the surface potential at the first measurement target part. The surface potential meter 8c is disposed at a position facing to a second measurement target part inside the region W1c in the Z direction, and measures the surface potential at the second measurement target part. The center of the substrate W1, the first measurement target part, and the second measurement target part are arranged in this order in the radial direction of the substrate W1. Accordingly, the surface potential meters 8a to 8c are arranged side by side in this order in the radial direction of the substrate W1. Each surface potential meter 8 measures the surface potential with respect to, for example, the ground potential. In this case, the substrate holder 1 (specifically, any part contacting with the substrate W1, such as a pin) may be electrically grounded. Accordingly, the surface potential meter 8 can measure at a higher accuracy, as the surface potential, the amount of electric charge (in other words, a charge amount) stored in the substrate W1.

<Movement Mechanism>

The movement mechanism 12 can move the substrate holder 1 in the Z direction. For example, the movement mechanism 12 is attached to the lower surface 1c of the substrate holder 1. The movement mechanism 12 can reciprocate the substrate holder 1 between a first position (refer to FIG. 3) at which the substrate holder 1 is closer to the ultraviolet irradiator 2 and a second position (refer to FIG. 2) at which the substrate holder 1 is further away from the ultraviolet irradiator 2. As described later, the first position is the position of the substrate holder 1 when the substrate W1 is subjected to processing using ultraviolet light, and the second position is the position of the substrate holder 1 when the substrate W1 is transferred. The movement mechanism 12 is, for example, a hydraulic cylinder, a uniaxially stage, or a motor. The movement mechanism 12 may be covered by a bellows surrounding the movement mechanism 12.

<Tubular Member and Gas Supplying Unit>

The tubular member 3 includes an inner peripheral surface 3a, an outer peripheral surface 3b, an upper surface 3c, and a lower surface 3d, and has a tubular shape.

The upper surface 3c couples the inner peripheral surface 3a with the outer peripheral surface 3b and is on a side closer to the ultraviolet irradiator 2. The lower surface 3d couples the inner peripheral surface 3a with the outer peripheral surface 3b and is on a side opposite to the ultraviolet irradiator 2. The inner peripheral surface 3a of the tubular member 3 has a diameter larger than that of the side surface 1b of the substrate holder 1. As illustrated in FIG. 3, the tubular member 3 surrounds the substrate holder 1 from outside while the substrate holder 1 is stopped at the first position.

While the substrate holder 1 is stopped at the first position (FIG. 3), the ultraviolet irradiator 2 emits ultraviolet light. Accordingly, the substrate W1 is subjected to processing using ultraviolet light. Simultaneously, the substrate W1 is surrounded by the ultraviolet irradiator 2, the tubular member 3, and the substrate holder 1 while the substrate holder 1 is stopped at the first position. Accordingly, in this state, the substrate W1c annot be easily taken out of the substrate holder 1.

Thus, the movement mechanism 12 moves the substrate holder 1 to the second position (FIG. 2). Accordingly, the substrate holder 1 is retracted from inside the inner peripheral surface 3a of the tubular member 3 in a direction departing from the ultraviolet irradiator 2. At the second position, the substrate W1 is positioned on a lower side (side opposite to the ultraviolet irradiator 2) of the lower surface 3d of the tubular member 3 in the vertical direction. This configuration allows the indexer robot 121 or the conveyance robot 123 to move the substrate W1 in the Y direction without being encumbered by the tubular member 3, thereby taking out the substrate W1. While the substrate holder 1 is stopped at the second position, the indexer robot 121 or the conveyance robot 123 can place the substrate W1 on the substrate holder 1.

The tubular member 3 includes through-holes 321 and 322. The through-holes 321 and 322 penetrate through the tubular member 3 and is communicated with an active space H1 between the ultraviolet irradiator 2 and the substrate W1. Specifically, the through-holes 321 and 322 each have one end opened at the upper surface 3c of the tubular member 3. The upper surface 3c of the tubular member 3 faces to the ultraviolet irradiator 2 through a void space at positions at which these openings are provided. A space between each opening and the ultraviolet irradiator 2 is continuous with the active space H1. Thus, the through-holes 321 and 322 are communicated with the active space H1.

The other end of each of the through-holes 321 and 322 is opened at the outer peripheral surface 3b of the tubular member 3. The other end of each of the through-holes 321 and 322 is coupled with the gas supplying unit 42. Specifically, the other end of the through-hole 321 is connected with a gas supplying unit 42a, and the other end of the through-hole 322 is connected with a gas supplying unit 42b. The gas supplying units 42a and 42b can supply gas such as oxygen or inert gas (for example, nitrogen or argon) to the active space H1 through the respective through-holes 321 and 322. In other words, the through-holes 321 and 322 function as gas supply paths.

The gas supplying units 42a and 42b each includes a pipe 421, an on-off valve 422, and a gas container 423. The gas supplying units 42a and 42b are identical to each other except for where the pipe 421 is connected. The following thus first describes any common configuration therebetween. The gas container 423 contains gas to be supplied to the active space H1. The gas container 423 is coupled with one end of the pipe 421. The on-off valve 422 is provided to the pipe 421 to switch opening and closing of the pipe 421. The following next describes where the other end of the pipe 421 of each of the gas supplying units 42a and 42b is connected. The other end of the pipe 421 of the gas supplying unit 42a is coupled with the other end of the through-hole 321, and the other end of the pipe 421 of the gas supplying unit 42b is coupled with the other end of the through-hole 322.

<Sealed Space>

The static eliminator 10 may include a sealed space. In the example illustrated in FIGS. 2 and 3, the ultraviolet irradiator 2, the tubular member 3, a partition 5, a floor 51 and a coupling member 52 are coupled with each other to form a sealed space. The coupling member 52 is a tubular member coupling an outer peripheral surface of the ultraviolet irradiator 2 with an outer peripheral part of the upper surface 3c of the tubular member 3. The openings of the through-holes 321 and 322 are provided at an inner peripheral part of the upper surface 3c, facing to a lower surface of the ultraviolet irradiator 2 through a void space in the Z direction. The partition 5 is coupled with the lower surface 3d of the tubular member 3. The partition 5 extends in the Z direction and is coupled with the floor 51. The substrate holder 1, the movement mechanism 12, and the surface potential meter 8 are housed in the sealed space formed by the ultraviolet irradiator 2, the tubular member 3, the partition 5, the floor 51, and the coupling member 52.

<Gas Exhaust>

The partition 5 includes a gas exhaust through-hole 53. The through-hole 53 penetrates through the partition 5 in the X direction. The through-hole 53 is coupled with the gas exhaust unit 61. The gas exhaust unit 61 includes, for example, a pipe 611 coupled with the through-hole 53. Air in the static eliminator 10 is externally exhausted through the pipe 611.

<Shutter>

The partition 5 includes a shutter (not illustrated) that functions as a port through which the substrate W1 is conveyed. When the shutter is opened, the inside and outside of the static eliminator 10 are communicated with each other. The indexer robot 121 or the conveyance robot 123 can take the substrate W1 into or out of the static eliminator 10 through the shutter being opened. When the static eliminator 10 is provided to the passing unit 122, a shutter for the indexer robot 121 and a shutter for the conveyance robot 123 are provided.

<Control Unit>

The control unit 7 controls the ultraviolet irradiator 2, the movement mechanism 12, the on-off valve 422 of the gas supplying unit 42, and the shutter. The control unit 7 receives inputting of surface potentials Va to Vc measured by the surface potential meters 8. The control unit 7 controls the irradiation amounts in the plurality of respective regions W1a to W1c based on the surface potentials Va to Vc. In this case, the control unit 7 functions as an irradiation amount controller configured to control an irradiation amount.

The control unit 7 may be an electronic circuit instrument including, for example, a data processing device and a storage medium. The data processing device may, for example, an arithmetic processing device such as a central processor unit (CPU). The storage unit may include a non-transitory storage medium (for example, a read only memory (ROM) or a hard disk) and a transitory storage medium (for example, a random access memory (RAM)). The non-transitory storage medium may store, for example, a computer program that defines processing executed by the control unit 7. The processing defined by the computer program can be executed by the control unit 7 through the processing device executing the computer program. Alternatively, part or all of the processing executed by the control unit 7 may be executed by hardware.

<Operation of Static Eliminator>

Figure 5:
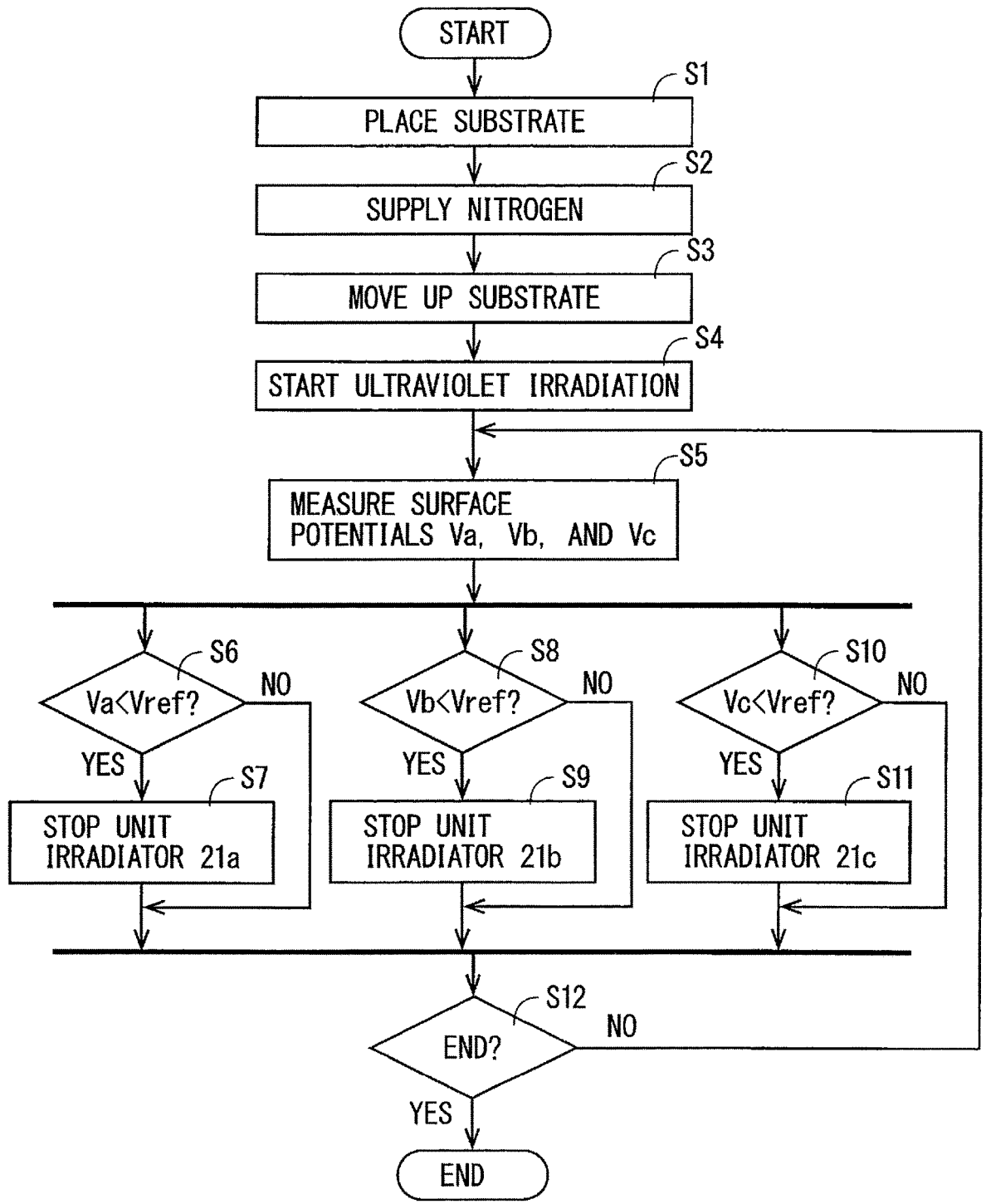
FIG. 5 is a flowchart illustrating an exemplary operation of the static eliminator.

FIG. 5 is a flowchart illustrating an exemplary operation of the static eliminator 10. The movement mechanism 12 is initially stopping the substrate holder 1 at the second position (FIG. 2). In this example, gas is constantly exhausted by the gas exhaust unit 61. At step S1, the control unit 7 opens the shutter, controls the indexer robot 121 or the conveyance robot 123 to place the substrate W1 on the substrate holder 1, and then closes the shutter. Subsequently at step S2, the control unit 7 controls, for example, the gas supplying unit 42 (specifically, the on-off valve 422) to start gas supply. Accordingly, gas is exhausted through the openings of the through-holes 321 and 322. The gas is, for example, nitrogen. Steps S1 and S2 may be executed in the opposite order or in parallel.

Subsequently at step S3, the control unit 7 controls the movement mechanism 12 to move the substrate holder 1 closer to the ultraviolet irradiator 2 and stop the substrate holder 1 at the first position. At the first position, the distance between the substrate W1 and the ultraviolet irradiator 2 is, for example, several millimeters to several tens millimeters approximately. More specifically, the distance is, for example, 2 mm.

Subsequently at step S4, the control unit 7 controls the ultraviolet irradiator 2 to emit ultraviolet light. More specifically, the control unit 7 controls the unit irradiators 21a to 21c to emit ultraviolet light. The control unit 7 may execute step S3 when a predetermined atmosphere is achieved in the active space H1. For example, the control unit 7 measures an elapsed time since step S2. The elapsed time is measured by a measurement circuit such as a timer circuit. The control unit 7 may determine whether the elapsed time is longer than a predetermined reference value and may execute step S3 when the determination is positive. Alternatively, the atmosphere in the active space H1 may be measured, and the control unit 7 may determine whether the predetermined atmosphere is achieved the active space H1 based on this measured value.

The irradiation with ultraviolet light by the unit irradiators 21a to 21c reduces electric charge of the substrate W1 with time. Thus, the charge amount of the substrate W1 is reduced. One reason is thought to be because of a photoelectric effect occurring at the substrate W1. The wavelength of ultraviolet light is, for example, less than or equal to 252 nm. In this wavelength range, electric charge can be effectively removed from the substrate W1. Wavelengths in 172±20 nm more effectively achieve the removal.

Subsequently at step S5, the surface potential meters 8a to 8c measure the surface potentials Va to Vc, respectively, and output the measured surface potentials Va to Vc to the control unit 7. The control unit 7 executes a pair of steps S6 and S7, a pair of steps S8 and S9, and a pair of steps S10 and S11. At step S6, the control unit 7 determines whether the absolute value of the surface potential Va is smaller than a reference value Vref. For example, the reference value Vref is set to be a value closer to zero in advance. When having determined that the surface potential Va is not smaller than the reference value Vref at step S6, the control unit 7 executes step S12 to be described later.

When having determined that the absolute value of the surface potential Va is smaller than the reference value Vref, the control unit 7 stops the ultraviolet irradiation by the unit irradiator 21a at step S7. The control unit 7 functions as an ultraviolet controller configured to control ultraviolet light. Accordingly, the ultraviolet irradiation of the region W1a is stopped. This can reduce or prevent reversed-polarity electric charge accumulation in the region W1a attributable to excessive ultraviolet irradiation. Subsequently, the control unit 7 executes step S12 to be described later.

At step S8, the control unit 7 determines whether the absolute value of the surface potential Vb is smaller than the reference value Vref. When having determined that the surface potential Vb is not smaller than the reference value Vref, the control unit 7 executes step S12 to be described later. When having determined that the absolute value of the surface potential Vb is smaller than the reference value Vref, the control unit 7 stops the ultraviolet irradiation by the unit irradiator 21b at step S9. Accordingly, the ultraviolet irradiation of the region W1b is stopped. This can reduce or prevent reversed-polarity electric charge accumulation in the region W1b attributable to excessive ultraviolet irradiation. Subsequently, the control unit 7 executes step S12 to be described later.

At step S10, the control unit 7 determines whether the absolute value of the surface potential Vc is smaller than the reference value Vref. When having determined that the surface potential Vc is not smaller than the reference value Vref, the control unit 7 executes step S12 to be described later. When having determined that the absolute value of the surface potential Vc is smaller than the reference value Vref, the control unit 7 stops the ultraviolet irradiation by the unit irradiator 21c at step S11. Accordingly, the ultraviolet irradiation of the region W1c is stopped. This can reduce or prevent reversed-polarity electric charge accumulation in the region W1c attributable to excessive ultraviolet irradiation. Subsequently, the control unit 7 executes step S12 to be described later.

At step S12, the control unit 7 determines whether to end static eliminating processing. Specifically, when having determined that the absolute values of the surface potentials Va, Vb, and Vc are all smaller than the reference value Vref, the control unit 7 ends the processing. When having determined that at least one of the absolute values of the surface potentials Va, Vb, and Vc is not smaller than the reference value Vref, the control unit 7 executes step S5 again.

As described above, the control unit 7 functions as a switching controller configured to control the irradiation amount of ultraviolet light in each of the plurality of regions W1a to W1c by performing switching between execution and stop of ultraviolet irradiation by each of the unit irradiators 21a to 21c. Accordingly, the regions W1a to W1c can be irradiated with ultraviolet light in irradiation amounts suitable for static elimination. This can reduce excessive ultraviolet irradiation of the regions W1a to W1c, thereby reducing or preventing reversed-polarity electric charge accumulation attributable to the excessive irradiation.

According to the operation illustrated in FIG. 5, the surface potential meters 8a to 8c measure the surface potentials Va to Vc, respectively, during the ultraviolet irradiation by the unit irradiators 21a to 21c (steps S4 and S5), and the control unit 7 determines stop of the unit irradiators 21a to 21c, respectively, based on the measured surface potentials Va to Vc (steps S6 to S11). In other words, the control unit 7 determines stop of the irradiation for each region based on the surface potential of each region while monitoring the surface potential during the irradiation. This can more reliably reduce or prevent reversed-polarity electric charge accumulation in each of the regions W1a to W1c, thereby achieving the removal of electric charge.

<Another Exemplary Static Eliminator>

Figure 6:
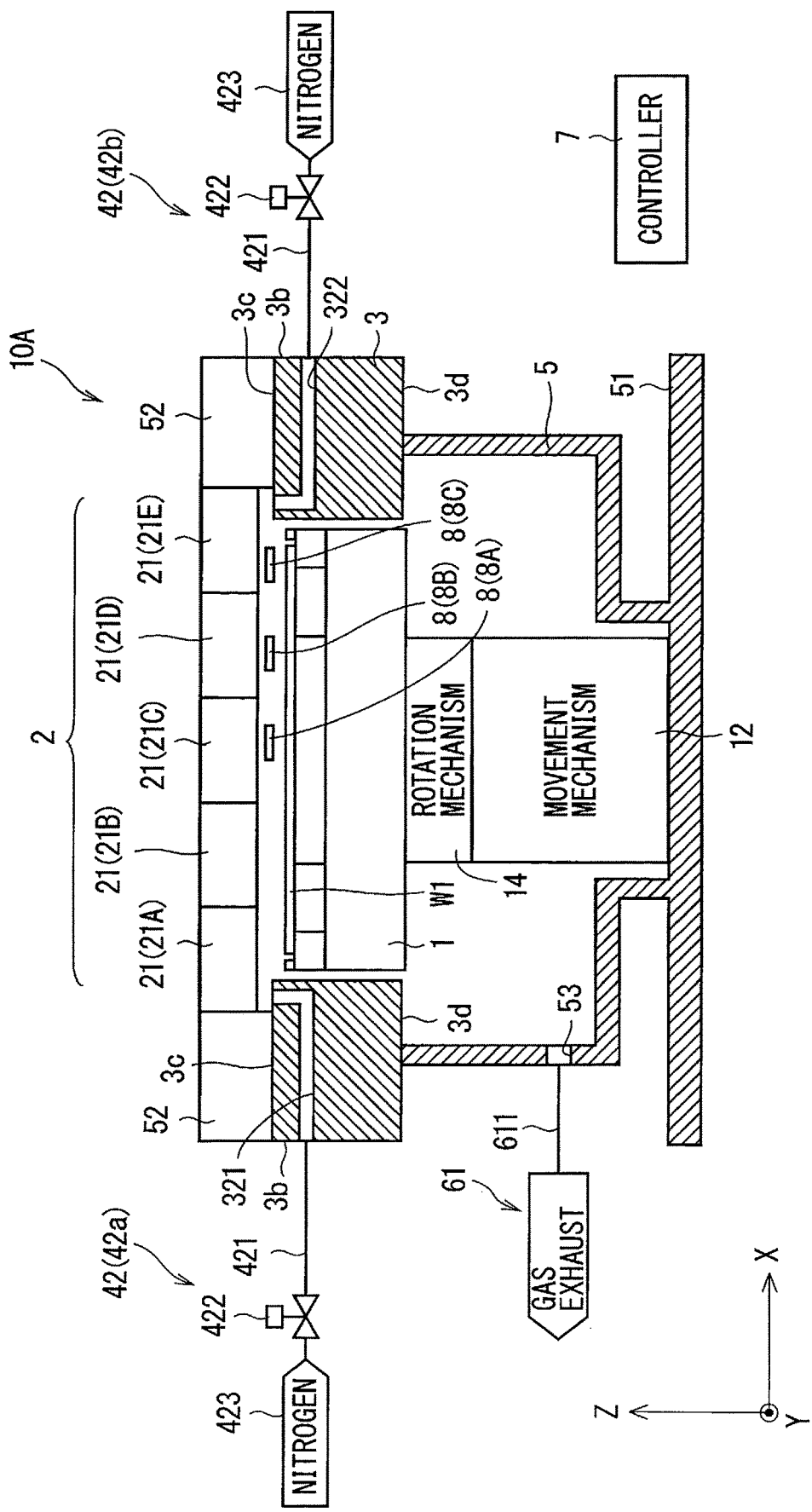
FIG. 6 is a diagram schematically illustrating the configuration of another exemplary static eliminator.

FIG. 6 is a diagram schematically illustrating the configuration of a static eliminator 10A as an example of the static eliminator 10. The static eliminator 10A differs from the static eliminator 10 in the configuration of the ultraviolet irradiator 2 and in that a rotation mechanism 14 is provided.

<Rotation Mechanism>

The rotation mechanism 14 rotates the substrate holder 1 and thus the substrate W1 in a horizontal plane. Specifically, the rotation mechanism 14 rotates the substrate holder 1 about a rotational axis through the center of the substrate W1 and orthogonal to the main surface of the substrate W1. The rotation mechanism 14 includes, for example, a motor that is controlled to rotate by the control unit 7.

<Ultraviolet Irradiator>

Figure 7:
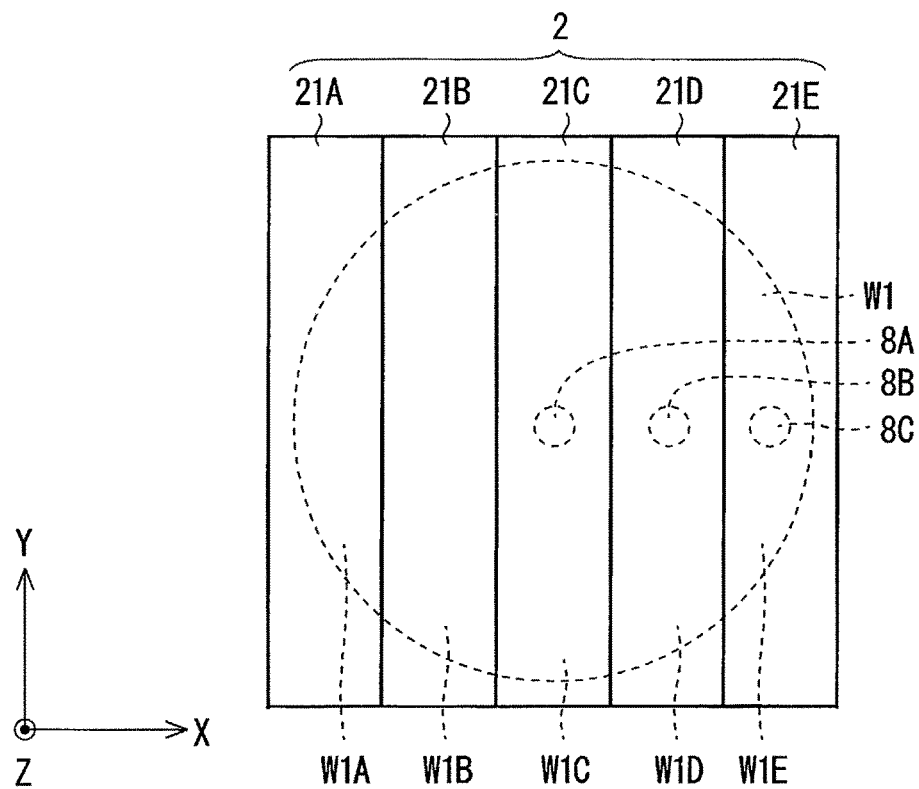
FIG. 7 is a diagram schematically illustrating another exemplary configuration of the substrate, the ultraviolet irradiator, and surface potential meters.

FIG. 7 is a diagram schematically illustrating an exemplary configuration of the substrate W1, the ultraviolet irradiator 2, and the surface potential meters 8. The ultraviolet irradiator 2 includes a plurality of unit irradiators 21 (in FIG. 7, unit irradiators 21A to 21E). The unit irradiators 21A to 21E have shapes identical to each other. More specifically, the unit irradiators 21A to 21E each have a bar shape extending in a direction (in FIG. 7, the Y direction) parallel to the substrate W1. The unit irradiators 21A to 21E are arranged in parallel. Specifically, the unit irradiators 21A to 21E are arranged side by side in this order in the X direction. In other words, the unit irradiators 21A and 21E are positioned at both ends in the X direction, and the unit irradiator 21C is positioned at the center in the X direction.

The unit irradiators 21A to 21E face to the main surface of the substrate W1 in the Z direction. Specifically, the unit irradiator 21C positioned at the center faces to, in the Z direction, the region W1C at the center of the substrate W1 in the X direction. More specifically, the unit irradiator 21C is disposed so that the unit irradiator 21C coincides with the center of the substrate W1 in the X direction. In other words, the unit irradiators 21A to 21E are disposed line symmetric with respect to the center of the substrate W1. The unit irradiators 21A and 21E positioned at both ends in the X direction face to, in the Z direction, the respective regions W1A and W1E near both ends of the substrate W1 in the X direction. The unit irradiator 21B faces to the region W1B between the regions W1A and W1C in the Z direction, and the unit irradiator 21D faces to the region W1D between the regions W1C and W1E in the Z direction. The unit irradiators 21A to 21E have lengths larger than the diameter of the substrate W1 in a longitudinal direction thereof.

The unit irradiators 21A to 21E mainly irradiate the respective regions W1A to W1E of the main surface of the substrate W1, which face to the unit irradiators 21A to 21E, with ultraviolet light. In the following, for simplification of description, it is assumed that the unit irradiator 21A only irradiates the region W1A with ultraviolet light. This assumption also applies to the unit irradiators 21B to 21E.

<Surface Potential Measuring Unit>

FIGS. 6 and 7 illustrate the surface potential meters 8A to 8C as the plurality of surface potential meters 8. The surface potential meter 8A measures a surface potential VA at the center of the substrate W1. The surface potential meter 8B measures a surface potential VB at a predetermined measurement target part inside the region W1D. The surface potential meter 8C measures a surface potential VC at a predetermined measurement target part inside the region W1E. The surface potential meters 8A to 8C are arranged side by side in this order in the radial direction of the substrate W1. Accordingly, the measurement target parts inside the regions W1D and W1E are arranged side by side in the radial direction.

<Control Unit>

The control unit 7 controls the rotation mechanism 14 to irradiate the unit irradiators 21A to 21E with ultraviolet light while rotating the substrate holder 1 and thus the substrate W1. The speed of rotation of the substrate W1 is set to be, for example, 1 rpm to 1000 rpm approximately.

Figure 8:
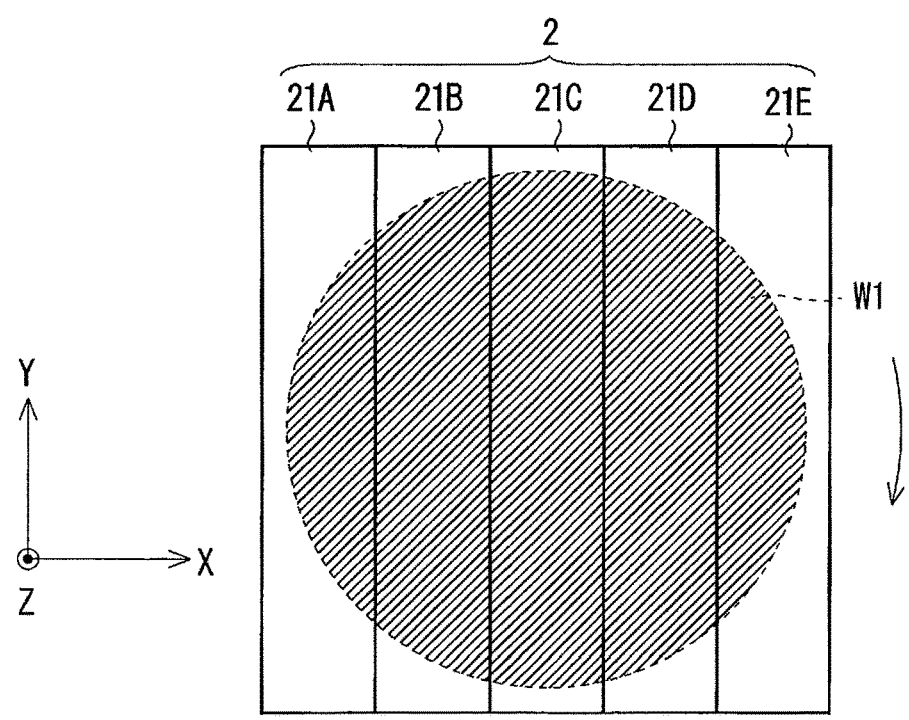
FIG. 8 is a diagram schematically illustrating the substrate and the ultraviolet irradiator.

FIG. 8 schematically illustrates an exemplary configuration of the unit irradiators 21A to 21E and the substrate W1. In FIG. 8, an arrow on the right side of the substrate W1 indicates rotation of the substrate W1. The same arrow notation applies to the drawings to be referred to below as appropriate. When the unit irradiators 21A to 21E emit ultraviolet light, the entire region of the main surface of the substrate W1 is uniformly irradiated with the ultraviolet light. In FIG. 8, hatching of the substrate W1 indicates the ultraviolet irradiation of the entire region of the main surface of the substrate W1.

Figure 28:
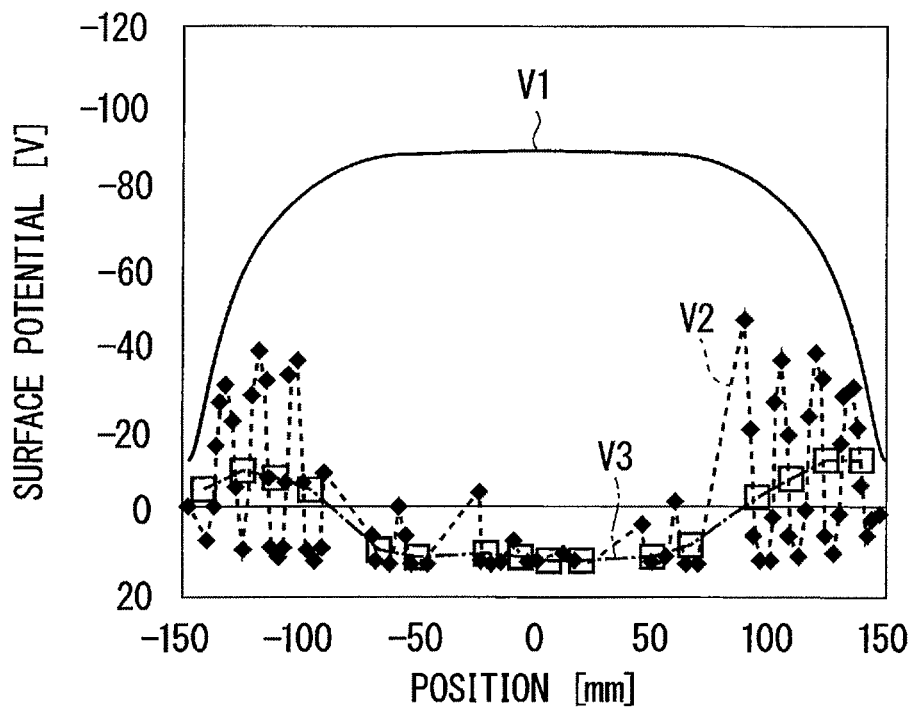
FIG. 28 is a graph schematically illustrating exemplary surface potential distribution.
Figure 29:
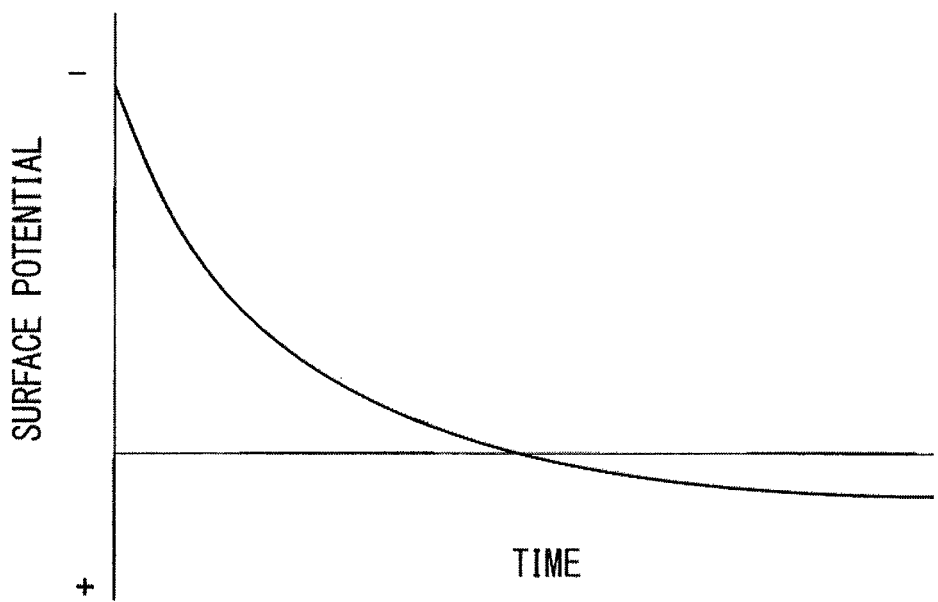
FIG. 29 is a graph illustrating exemplary surface potential temporal change.

According to surface potential distribution V3 illustrated in FIG. 28, it is expected that electric charge near the center of the substrate W1 is more likely to be removed than electric charge near the periphery of the substrate W1. Thus, the irradiation amount of ultraviolet light near the periphery of the substrate W1 is increased as compared to the irradiation amount of ultraviolet light near the center of the substrate W1.

Figure 9:
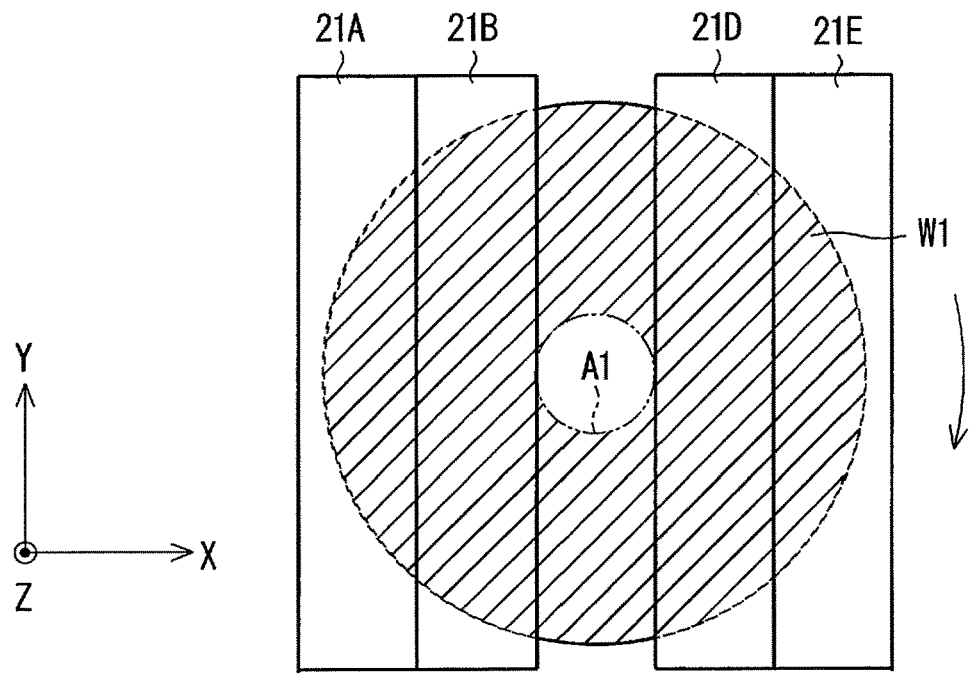
FIG. 9 is a diagram schematically illustrating the substrate and the ultraviolet irradiator.

The control unit 7 stops the ultraviolet irradiation by the unit irradiator 21C at the center, while keeping the substrate W1 rotating. FIG. 9 schematically illustrates an exemplary configuration of the unit irradiators 21A, 21B, 21D, and 21E and the substrate W1. Since the unit irradiator 21C is stopped by the control unit 7, FIG. 9 omits illustration of the unit irradiator 21C.

A region outside of a virtual circle A1 on the main surface of the substrate W1 is irradiated with ultraviolet light by the unit irradiators 21A, 21B, 21D, and 21E, while a region inside of the virtual circle A1 is not irradiated with ultraviolet light. The virtual circle A1 touches both facing surfaces of the respective unit irradiators 21B and 21D. As described above, when the ultraviolet irradiation by the unit irradiator 21C is stopped, the ultraviolet irradiation of the region inside of the virtual circle A1 is stopped. In this manner, the region outside of the virtual circle A1 can be irradiated with ultraviolet light in an amount larger than the irradiation amount of ultraviolet light in the region inside of the virtual circle A1.

Each point in the region outside of the virtual circle A1 is sometimes positioned between the unit irradiators 21B and 21D due to rotation of the substrate W1. In such a case, the point is not irradiated with ultraviolet light. The point is irradiated with ultraviolet light when positioned directly below any of the unit irradiators 21A, 21B, 21D, and 21E through rotation of the substrate W1. In other words, the point is not constantly irradiated with ultraviolet light through one rotation of the substrate W1. Accordingly, the irradiation amount (irradiation amount per one rotation of the substrate W1) of ultraviolet light in the region outside of the virtual circle A1 is smaller than at the ultraviolet irradiation by all of the unit irradiators 21A to 21E. In FIGS. 8 and 9, the magnitude of the irradiation amount per one rotation is schematically indicated by the density of hatching of the substrate W1.

Figure 10:
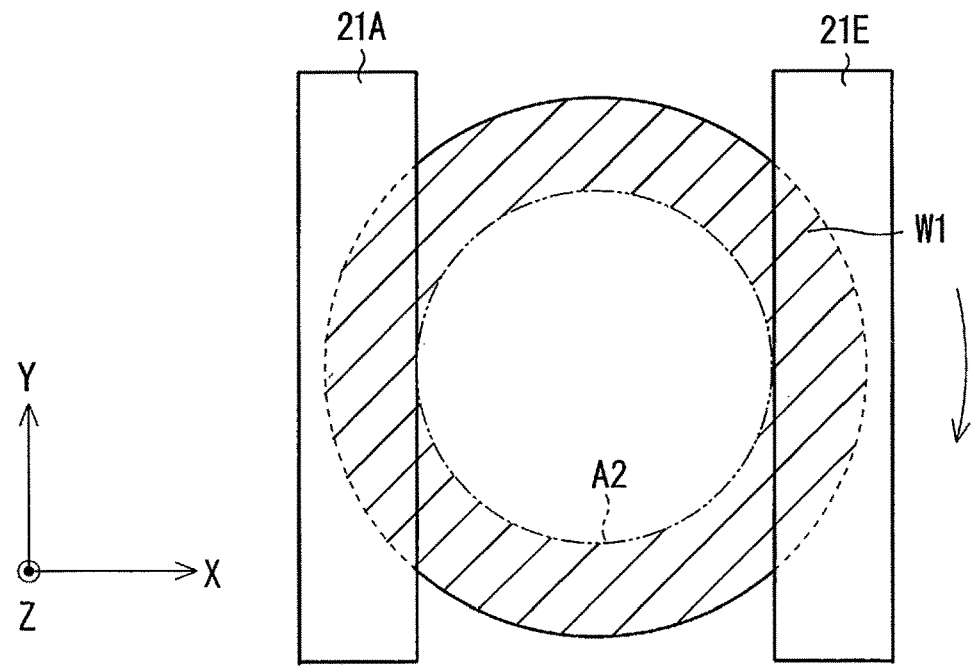
FIG. 10 is a diagram schematically illustrating the substrate and the ultraviolet irradiator.

The control unit 7 additionally stops the ultraviolet irradiation by the unit irradiators 21B and 21D while keeping the substrate W1 rotating. FIG. 10 schematically illustrates an exemplary configuration of the unit irradiators 21A and 21E and the substrate W1. Since the ultraviolet irradiation by the unit irradiators 21B to 21D is stopped by the control unit 7, FIG. 10 omits illustration of the unit irradiators 21B to 21D.

In this case, a region outside of a virtual circle A2 on the main surface of the substrate W1 is irradiated with ultraviolet light by the unit irradiators 21A and 21E, but a region inside of the virtual circle A2 is not irradiated with ultraviolet light. The virtual circle A2 touches both facing surfaces of the respective unit irradiators 21A and 21E. The virtual circle A2 has a diameter larger than that of the virtual circle A1. Thus, the ultraviolet irradiation of the larger region inside of the virtual circle A2 is stopped when the ultraviolet irradiation by the unit irradiators 21B to 21D is stopped. Accordingly, the region outside of the virtual circle A2, which is a more peripheral region, can be irradiated with ultraviolet light in an amount larger than the irradiation amount of ultraviolet light in the region inside of the virtual circle A2.

The region outside of the virtual circle A2 is not constantly irradiated with ultraviolet light. When positioned between the unit irradiators 21A and 21E, each point inside the region outside of the virtual circle A2 is not irradiated with ultraviolet light. When the unit irradiators 21B and 21D are additionally stopped, a larger range is not irradiated with ultraviolet light, and accordingly, the irradiation amount in the region outside of the virtual circle A2 per one rotation is reduced as compared to the configuration illustrated in FIG. 9. In FIGS. 9 and 10, the magnitude of the irradiation amount per one rotation is schematically indicated by the density of hatching of the substrate W1.

Figure 11:
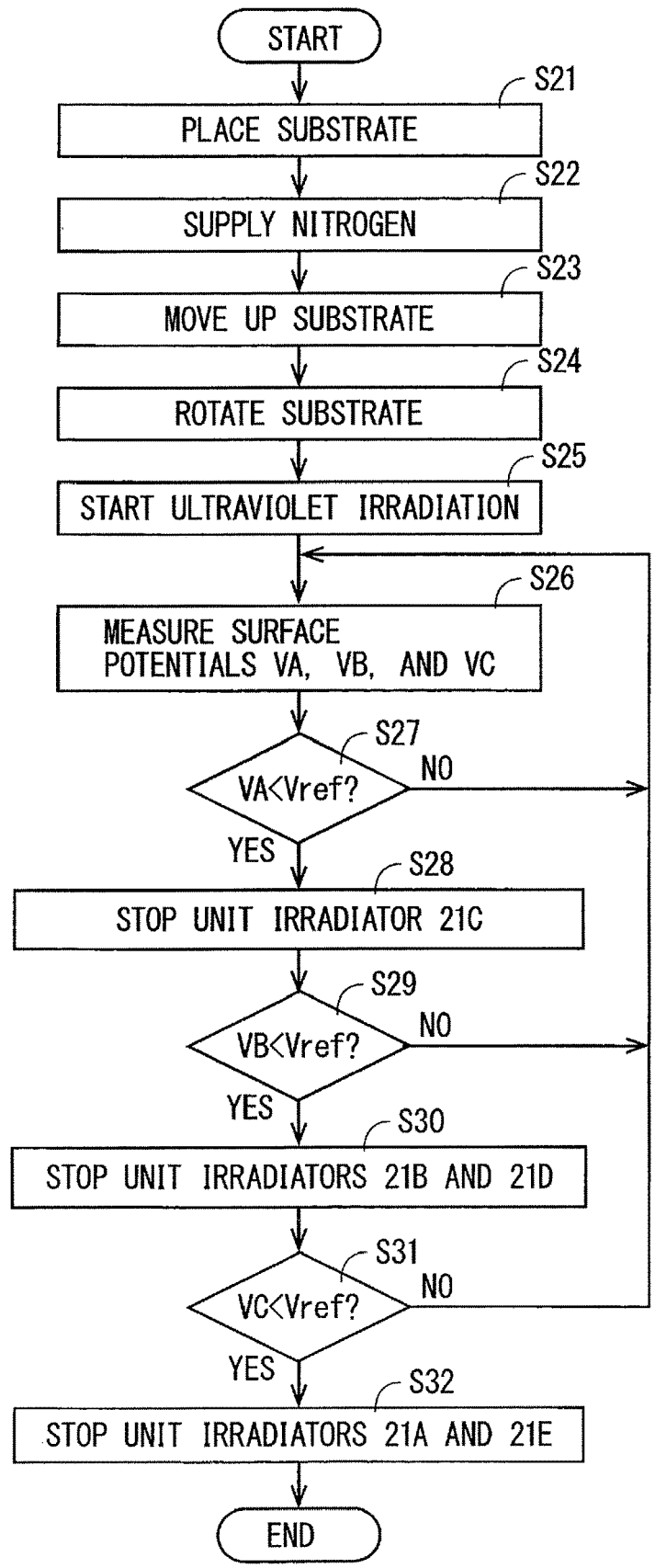
FIG. 11 is a flowchart illustrating an exemplary operation of the static eliminator.

FIG. 11 is a flowchart illustrating an exemplary operation of the static eliminator 10A. The following description assumes a case in which the surface potential near the center of the substrate W1 becomes close to zero earlier than the surface potential near the periphery thereof through ultraviolet irradiation of the entire surface of the substrate W1.

Steps S21 to S23 are identical to steps S1 to S3, respectively. Following step S23, the control unit 7 controls the rotation mechanism 14 to rotate the substrate holder 1 and thus the substrate W1 at step S24. Subsequently at step S25, the control unit 7 controls the unit irradiators 21A to 21E to emit ultraviolet light. Accordingly, the entire main surface of the substrate W1 is irradiated with the ultraviolet light. Subsequently at step S26, the surface potential meters 8A to 8C measure the surface potentials VA to VC, respectively, and output the measured surface potentials VA to VC to the control unit 7.

Subsequently at step S27, the control unit 7 determines whether the absolute value of the surface potential VA is smaller than the reference value Vref. When having determined that the surface potential VA is not smaller than the reference value Vref, the control unit 7 executes again step S26. When having determined that the absolute value of the surface potential VA is smaller than the reference value Vref, the control unit 7 stops the ultraviolet irradiation by the unit irradiator 21C at the center at step S28. Accordingly, the ultraviolet irradiation of the region inside of the virtual circle A1 is stopped. This can reduce or prevent reversed-polarity electric charge accumulation in the region inside of the virtual circle A1 attributable to excessive ultraviolet irradiation.

Subsequently at step S29, the control unit 7 determines whether the absolute value of the surface potential VB is smaller than the reference value Vref. When having determined that the surface potential VB is not smaller than the reference value Vref, the control unit 7 executes step S26 again. When having determined that the absolute value of the surface potential VB is smaller than the reference value Vref, the control unit 7 stops the ultraviolet irradiation by the unit irradiators 21B and 21D at step S30. Accordingly, the ultraviolet irradiation of the region inside of the virtual circle A2 is stopped. This can reduce or prevent reversed-polarity electric charge accumulation in the region inside of the virtual circle A2 attributable to excessive ultraviolet irradiation.

Subsequently at step S31, the control unit 7 determines whether the absolute value of the surface potential VC is smaller than the reference value Vref. When having determined that the surface potential VC is not smaller than the reference value Vref, the control unit 7 executes step S26 again. When having determined that the absolute value of the surface potential VC is smaller than the reference value Vref, the control unit 7 stops the ultraviolet irradiation by the unit irradiators 21A and 21E at step S32. Accordingly, the ultraviolet irradiation of the main surface of the substrate W1 is stopped. This ends static eliminating processing of the substrate W1.

As described above, in the static eliminator 10A, each region of the main surface of the substrate W1c an be irradiated with ultraviolet light in an irradiation amount suitable for static elimination. This can reduce excessive ultraviolet irradiation of each region, thereby reducing or preventing reversed-polarity electric charge accumulation attributable to the excessive irradiation.

The static eliminator 10A can stop the ultraviolet irradiation of the region inside of the virtual circle A1 and reduce the irradiation amount in the region outside of the virtual circle A1 by stopping the irradiation by the unit irradiator 21C at the center (refer to FIG. 9). Similarly, the static eliminator 10A can stop the ultraviolet irradiation of the region inside of the virtual circle A2 and reduce the irradiation amount of the region outside of the virtual circle A2 by stopping the irradiation by the unit irradiators 21B to 21C (refer to FIG. 10). Accordingly, electric charge near the periphery can be removed at a lower speed, which leads to more accurate control of the surface potential near the periphery. Although the charge amount near the center of the substrate W1 is initially large (FIG. 28), electric charge near the center of the substrate W1c an be immediately removed through initial irradiation by the unit irradiators 21A to 21D.

In the above-described example, the unit irradiators 21 are stopped sequentially from the center toward both sides in the X direction, but the present invention is not necessarily limited thereto. The control unit 7 only needs to stop, when the surface potential in a region decreases with time, the unit irradiator 21 corresponding to the surface potential.

<Surface Potential Measurement Timing>

In the above-described example, the surface potential is measured during ultraviolet irradiation. However, the surface potential meters 8 may measure the surface potential before ultraviolet irradiation. In this case, the control unit 7 determines, based on the measured surface potential, a necessary irradiation amount required for static elimination. The relation between the surface potential and the necessary irradiation amount may be set in advance by, for example, experiment or simulation. The relation may be stored in, for example, the storage unit of the control unit 7. Then, the control unit 7 determines the irradiation time of each unit irradiator 21 based on the necessary irradiation amount. The control unit 7 may control the unit irradiator 21 based on the determined irradiation time. Specifically, the control unit 7 measures an elapsed time since ultraviolet irradiation by each unit irradiator 21, and stops the ultraviolet irradiation by the unit irradiator 21 when the measured elapsed time exceeds the determined irradiation time.

In this manner, each unit irradiator 21 can emit ultraviolet light in an irradiation amount suitable for the corresponding region. This can reduce or prevent reversed-polarity electric charge accumulation attributable to excessive ultraviolet irradiation.

In this case, the surface potential meters 8 do not necessarily need to be provided to the static eliminator 10. The surface potential meters 8 may be provided outside of the static eliminator 10 and measure the surface potential of the substrate W1. The control unit 7 may acquire this information on the surface potential through, for example, communication.

<Intensity of Ultraviolet Light from Unit Irradiator 21>

The control unit 7 may control the plurality of unit irradiators 21 to emit ultraviolet light in mutually different intensities. In this case, the control unit 7 functions as an intensity controlling unit. For example, the pair of electrodes of each unit irradiator 21 are attached outside of a quartz glass. With this structure, the intensity of ultraviolet light depends on voltage between the pair of electrodes. The control unit 7 applies a variable voltage between the pair of electrodes. For example, the unit irradiator 21 includes an inverter. The inverter outputs an alternating-current voltage with a variable amplitude. A higher amplitude leads to a higher intensity of ultraviolet light.

The control unit 7 may control, for example, the intensity of ultraviolet light from the unit irradiator 21c to be higher than the intensity of ultraviolet light from the unit irradiator 21b, and control the intensity of ultraviolet light from the unit irradiator 21b to be higher than the intensity of ultraviolet light from the unit irradiator 21a. In this manner, the region W1c, in which charge is reduced more slowly, can be irradiated with ultraviolet light in a higher intensity to increase the speed of static elimination. In addition, reduced electric power consumption can be achieved by reducing the intensity of ultraviolet light from the unit irradiator 21a.

Similarly, the control unit 7 may control, for example, the intensities of ultraviolet light from the unit irradiators 21A and 21E to be higher than the intensities of ultraviolet light from the unit irradiators 21B and 21D, and control the intensities of ultraviolet light from the unit irradiators 21B and 21D to be higher than the intensity of ultraviolet light from the unit irradiator 21C.

<Shape of Unit Irradiator and Arrangement of Surface Potential Measuring Unit>

Figure 12:
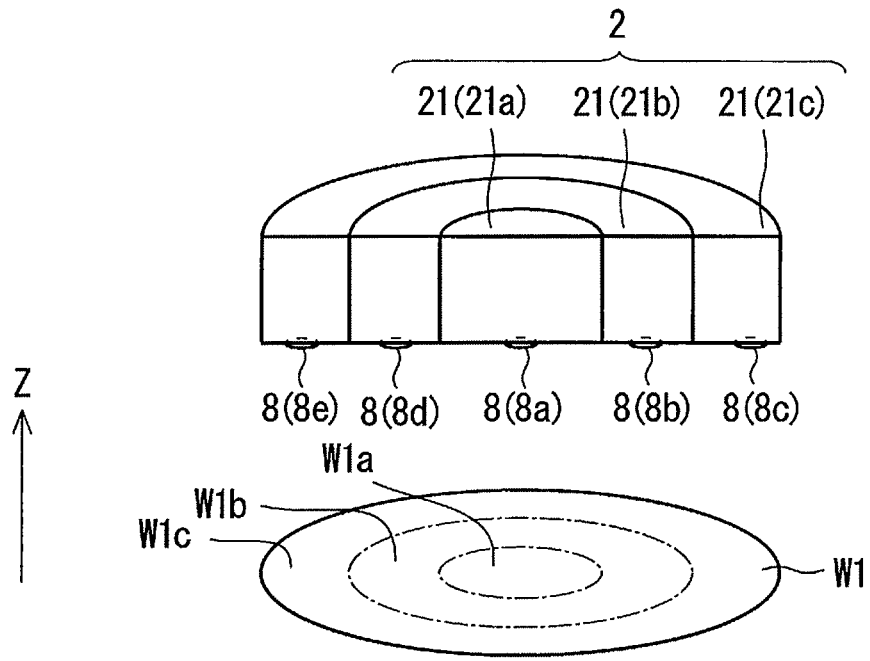
FIG. 12 is a diagram schematically illustrating another example of the ultraviolet irradiator and the surface potential meter.

In the above-described example, the unit irradiators 21 each have a circular shape, a ring shape, or a linear shape (bar). FIG. 12 is a perspective view schematically illustrating another example of the ultraviolet irradiator 2. The unit irradiator 21a has a semicircular shape when viewed in the Z direction, and the unit irradiator 21b and 21c each extend in an arc shape. The unit irradiator 21b and 21c may each have a C shape. The unit irradiators 21a to 21c have diameters different from each other. Specifically, the outer diameter of the unit irradiator 21a is smaller than the inner diameter of the unit irradiator 21b, and the outer diameter of the unit irradiator 21b is smaller than the inner diameter of the unit irradiator 21c. The unit irradiators 21a to 21c are concentrically arranged. With this configuration, too, the unit irradiators 21a to 21c can irradiate the entire regions W1a to W1c, respectively, with ultraviolet light through rotation of the substrate W1.

The surface potential meters 8 do not need to be arranged side by side along the radius. As illustrated in, for example, FIG. 12, the surface potential meters 8 may be arranged side by side along the diameter. In FIG. 12, surface potential meters 8a to 8e are illustrated as the plurality of surface potential meters 8. The surface potential meter 8a is disposed at a position facing to the center of the substrate W1. The surface potential meters 8a to 8e are arranged side by side along the diameter of the substrate W1. Specifically, the surface potential meters 8b and 8d are disposed at positions facing to the region W1b, on both sides of the surface potential meter 8a. The surface potential meters 8c and 8e are disposed at positions facing to the region W1c, on both sides of the surface potential meter 8a.

A statistical value (for example, an average value) of surface potentials measured by the surface potential meters 8b and 8d may be employed as the surface potential in the region W1b. In this case, the control unit 7 may stop the unit irradiator 21b (alternatively, the unit irradiators 21B and 21D) corresponding to the region W1b when the absolute value of the statistical value of the surface potentials measured by the surface potential meters 8b and 8d is smaller than the reference value Vref. Similarly, a statistical value (for example, an average value) of surface potentials measured by the surface potential meters 8c and 8e may be employed as the surface potential in the region W1c.

Figure 13:
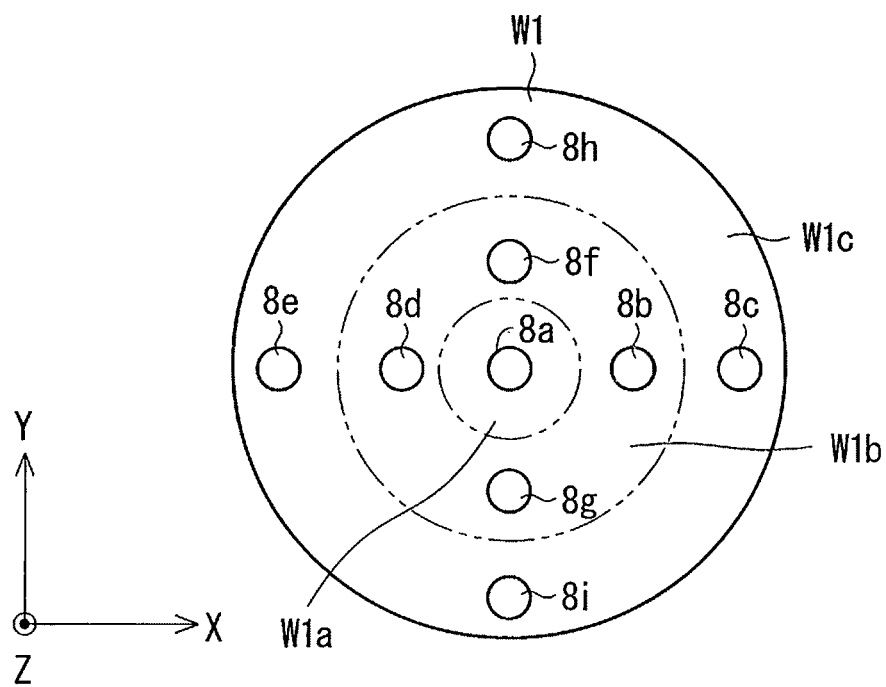
FIG. 13 is a diagram schematically illustrating another example of the ultraviolet irradiator and the surface potential meter.

The surface potential meters 8 may be arranged in a cross shape. FIG. 13 is a diagram schematically illustrating an example of the substrate W1 and the surface potential meters 8. In the example illustrated in FIG. 13, surface potential meters 8a to 8i as nine surface potential meters 8 are arranged in a cross shape. The surface potential meter 8a is disposed at a position facing to the center of the substrate W1, the surface potential meters 8a to 8e are arranged side by side in the X direction, and the surface potential meters 8a and 8f to 8i are arranged side by side in the Y direction. The surface potential meters 8b, 8d, 8f, and 8g face to the region W1b, and the surface potential meters 8c, 8e, 8h, and 8i face to the region W1c.

A statistical value (for example, an average value) of surface potentials measured by the surface potential meters 8b, 8d, 8f, and 8g may be employed as the surface potential in the region W1b. This also applies to the surface potential in the region W1c.

Figure 14:
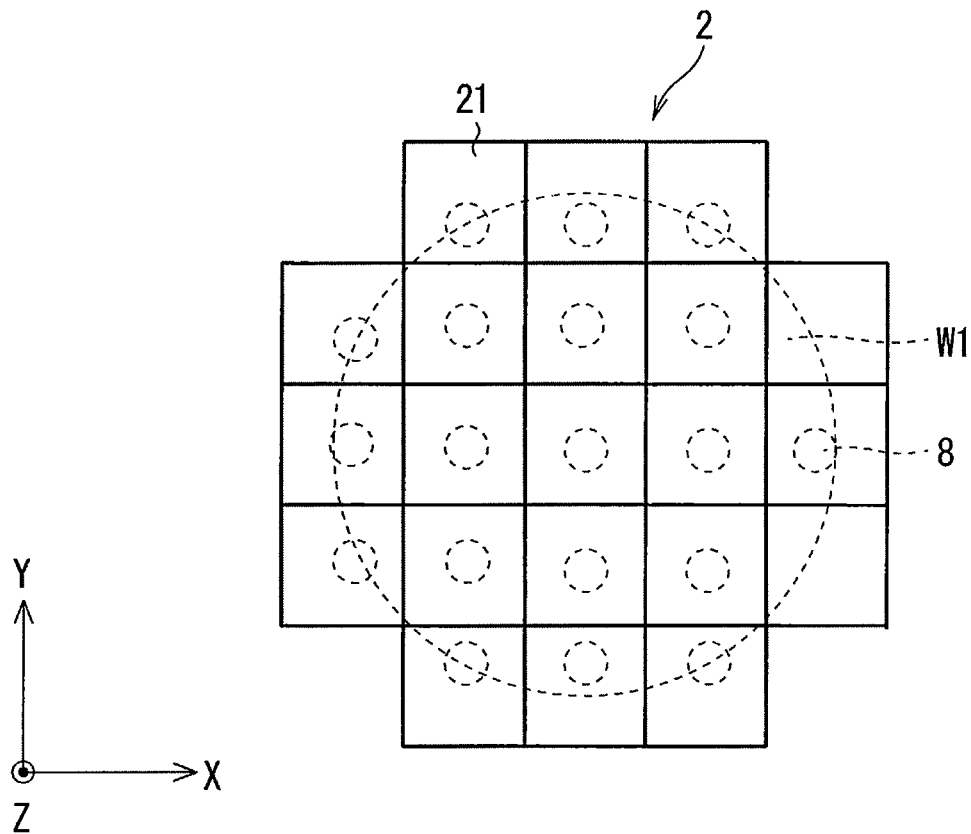
FIG. 14 is a diagram schematically illustrating another example of the ultraviolet irradiator and the surface potential meter.

The plurality of unit irradiators 21 may be arranged in a lattice. FIG. 14 is a diagram schematically illustrating an example of the substrate W1, the ultraviolet irradiator 2, and the surface potential meters 8. The plurality of unit irradiators 21 each have a rectangular shape when viewed in the Z direction, and are arranged in a lattice. The plurality of surface potential meters 8 are arranged in a lattice corresponding to the unit irradiators 21. Each surface potential meter 8 measures the surface potential in a region of the main surface of the substrate W1, which is irradiated by the corresponding unit irradiator 21.

The control unit 7 controls execution and stop of ultraviolet irradiation by the ultraviolet irradiator 2 based on the surface potentials measured by the surface potential meters 8. Specifically, the control unit 7 stops any of the unit irradiators 21 when the absolute value of the surface potential measured by the corresponding surface potential meter 8 is determined to be smaller than the reference value Vref.

Figure 15:
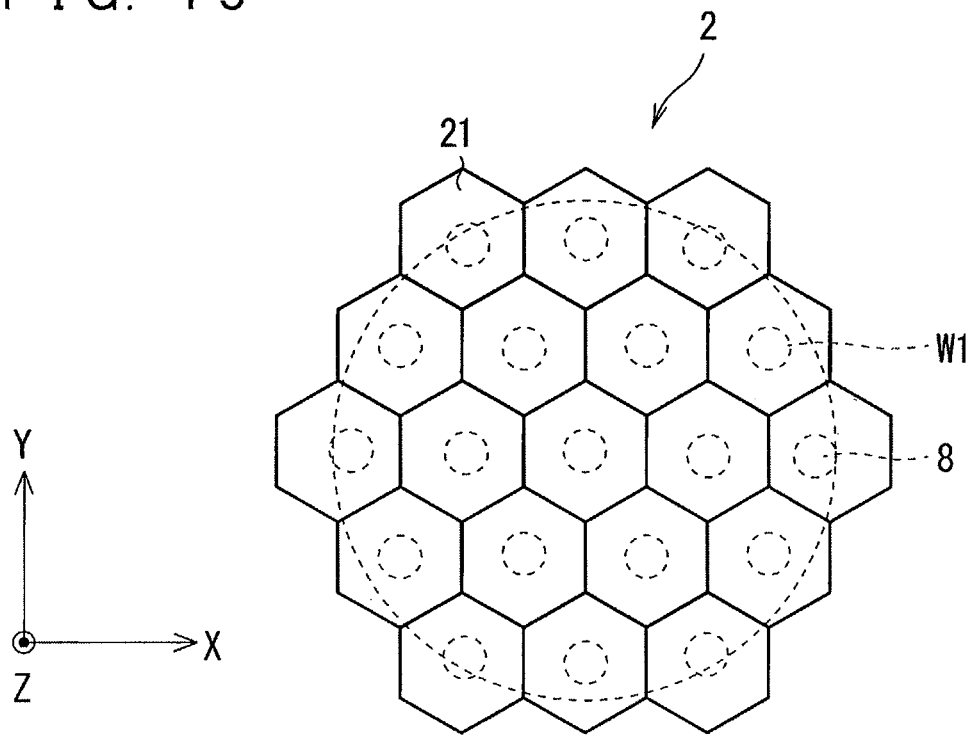
FIG. 15 is a diagram schematically illustrating another example of the ultraviolet irradiator and the surface potential meter.

The unit irradiators 21 may be arranged in a honeycomb shape. FIG. 15 is a diagram schematically illustrating an example of the substrate W1, the ultraviolet irradiator 2, and the surface potential meters 8. The plurality of unit irradiators 21 each have a hexagon shape when viewed in the Z direction, and are arranged in a honeycomb shape. The plurality of surface potential meters 8 are disposed at positions facing to the unit irradiators 21. Each surface potential meter 8 measures the surface potential in a region of the main surface of the substrate W1, which is irradiated by the corresponding unit irradiator 21.

The control unit 7 controls execution and stop of ultraviolet irradiation by the ultraviolet irradiator 2 based on the surface potentials measured by the surface potential meters 8. Specifically, the control unit 7 stops any of the unit irradiators 21 when the absolute value of the surface potential measured by the corresponding surface potential meter 8 is determined to be smaller than the reference value Vref.

Second Preferred Embodiment

Figure 16:
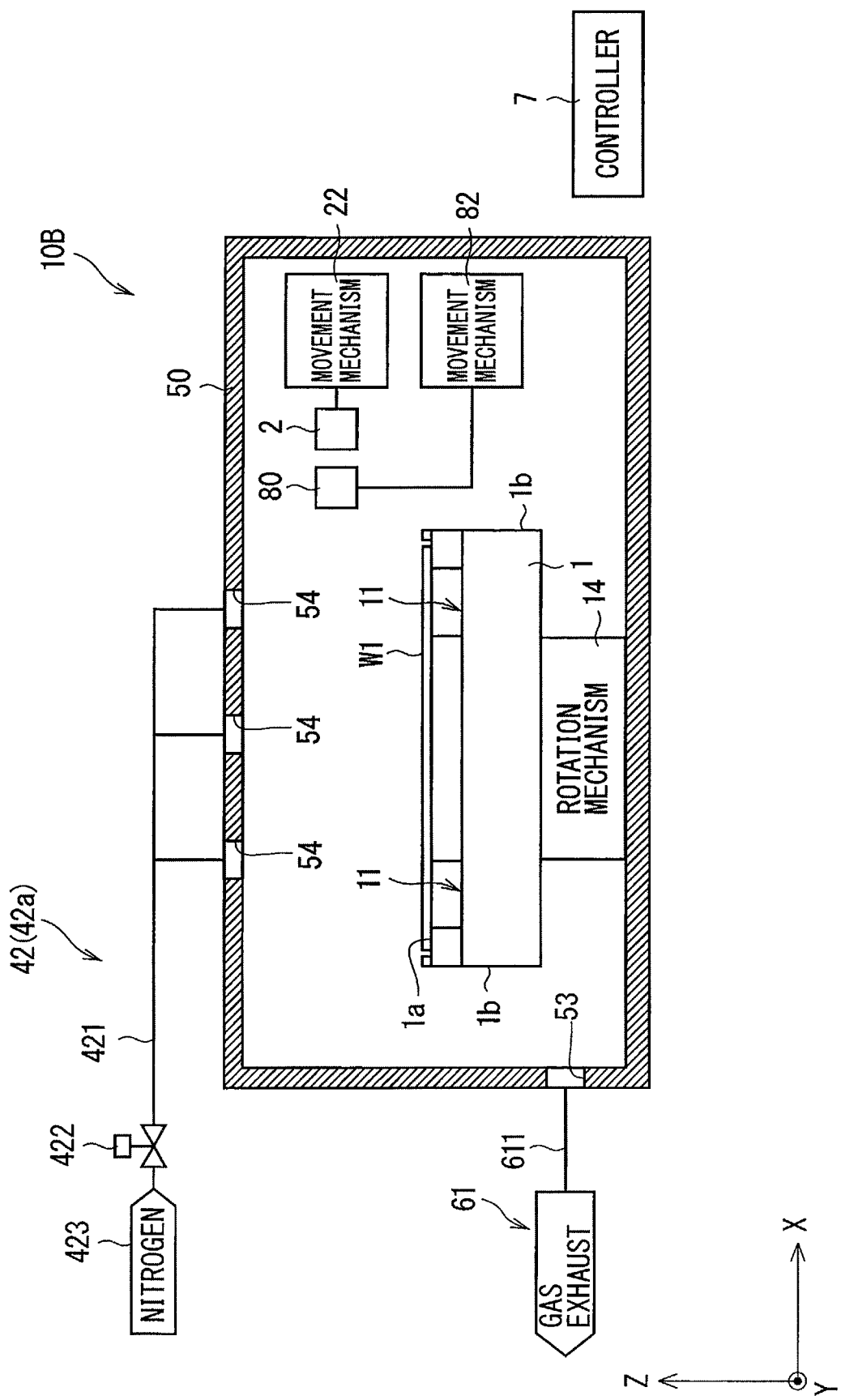
FIG. 16 is a diagram schematically illustrating another exemplary configuration of the static eliminator.
Figure 17:
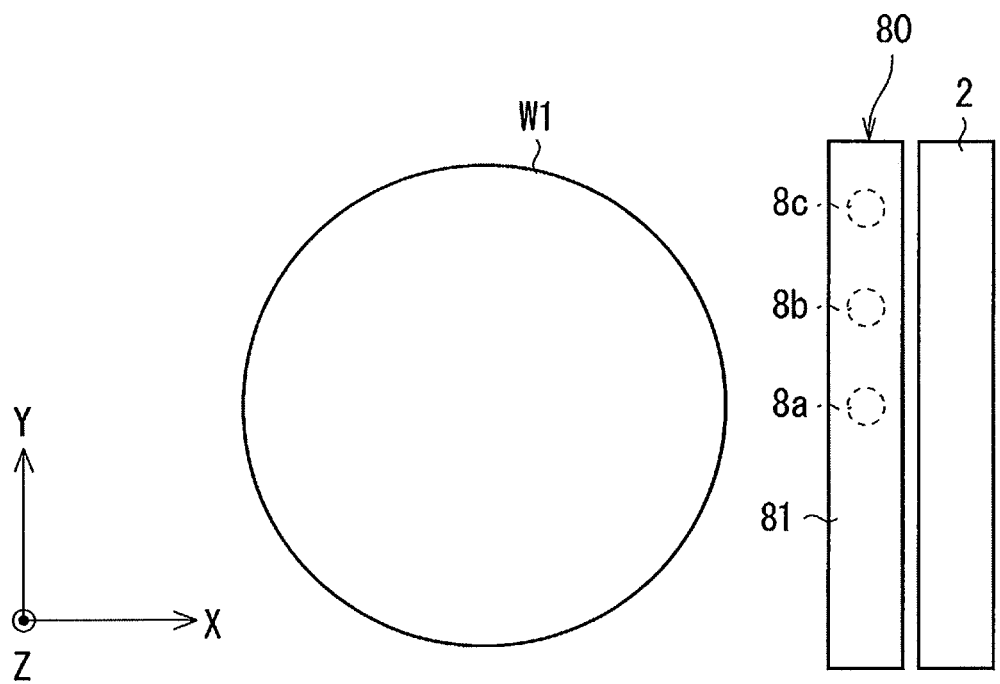
FIG. 17 is a diagram schematically illustrating an example of the substrate, the ultraviolet irradiator, and a measurement unit.

FIG. 16 is a diagram schematically illustrating the configuration of an static eliminator 10B as an example of the static eliminator 10. The static eliminator 10B includes a chamber 50, the substrate holder 1, the rotation mechanism 14, the ultraviolet irradiator 2, a measurement unit 80, movement mechanisms 22 and 82, the gas supplying unit 42, and the gas exhaust unit 61. FIG. 17 is a diagram schematically illustrating an exemplary configuration of the substrate W1, the measurement unit 80, and the ultraviolet irradiator 2.

The chamber 50 forms a sealed space housing the substrate holder 1, the ultraviolet irradiator 2, the measurement unit 80, and the movement mechanisms 22 and 82. A specific example of the substrate holder 1 is same as that of the first preferred embodiment.

The chamber 50 includes a through-hole 54 at, for example, a ceiling part. The through-hole 54 penetrates through the ceiling part in the Z direction. The through-hole 54 is connected with the gas supplying unit 42. The gas supplying unit 42 supplies gas into the chamber 50 through the through-hole 54. The through-hole 54 faces to the substrate W1 in the Z direction. The gas from the gas supplying unit 42 is supplied to an active space on the main surface of the substrate W1. A specific example of the gas supplying unit 42 same as that of the first preferred embodiment.

The chamber 50 includes the through-hole 53, for example, at a sidewall. The through-hole 53 penetrates through the sidewall in, for example, the X direction. The through-hole 53 is connected with the gas exhaust unit 61. The gas exhaust unit 61 externally exhausts air in the chamber 50 through the through-hole 53.

The chamber 50 includes the shutter (not illustrated) that functions as a port through which the substrate W1 is conveyed. The shutter is controlled by the control unit 7.

The measurement unit 80 includes a bar member 81 and the plurality of surface potential meters 8a to 8c. The member 81 is disposed in such a posture that a longitudinal direction thereof is aligned with the Y direction. The surface potential meters 8a to 8c are attached to a surface of the member 81 on a lower side (side closer to the substrate W1). The surface potential meters 8a to 8c are arranged side by side in the Y direction.

Figure 18:
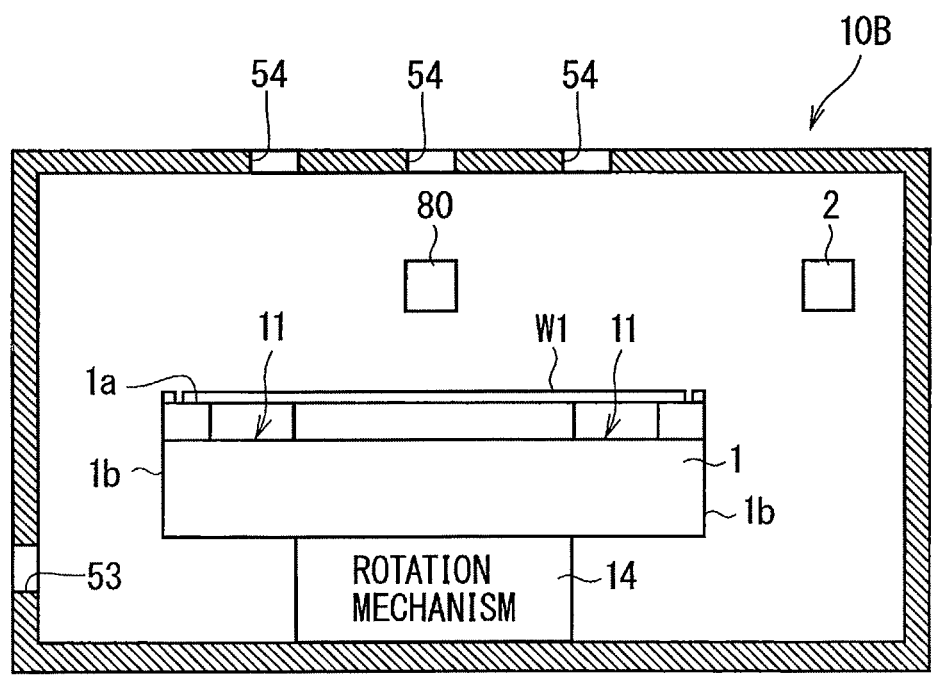
FIG. 18 is a diagram schematically illustrating an exemplary static eliminator.
Figure 19:
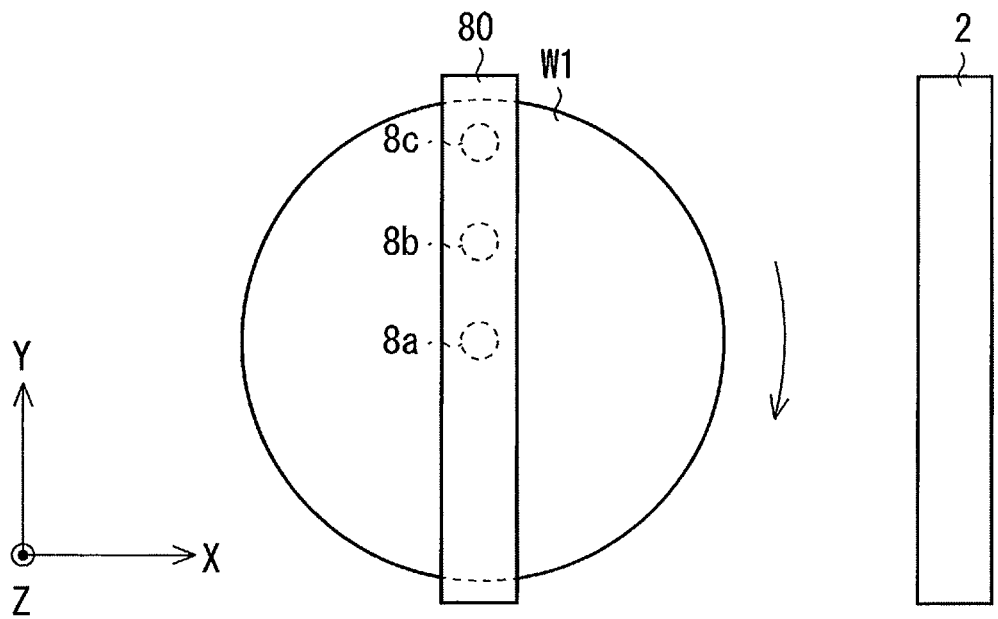
FIG. 19 is a diagram schematically illustrating an example of the substrate, the ultraviolet irradiator, and the measurement unit.

The movement mechanism 82 moves the measurement unit 80 between a measurement position and a non-measurement position to be described next. At the measurement position, the measurement unit 80 faces to the main surface of the substrate W1 at a predetermined distance in the Z direction. The predetermined distance is set to be, for example, several millimeters or smaller. FIG. 18 schematically illustrates an exemplary configuration of the static eliminator 10B when the measurement unit 80 is stopping at the measurement position. For simplification, FIG. 18 omits illustration of the movement mechanisms 22 and 82, the gas supplying unit 42, and the gas exhaust unit 61. FIG. 19 is a diagram schematically illustrating an exemplary configuration of the substrate W1, the measurement unit 80, and the ultraviolet irradiator 2 when the measurement unit 80 is stopping at the measurement position.

While the measurement unit 80 is stopping at the measurement position, the surface potential meters 8a to 8c face to the main surface of the substrate W1 in the Z direction. Specifically, the surface potential meter 8a faces to the main surface of the center of the substrate W1 in the Z direction. The surface potential meters 8a to 8c are arranged in the Y direction, that is, in the radial direction of the substrate W1. Accordingly, the surface potential meters 8a to 8c measure the surface potential at mutually different positions in the radial direction on the main surface of the substrate W1. The surface potential meter 8c is positioned closer to the periphery of the substrate W1 than the surface potential meter 8b.

The non-measurement position is different from the above-described measurement position, and is, for example, a position at which the measurement unit 80 does not face to the substrate W1 in the Z direction (FIGS. 16 and 17).

The movement mechanism 82 is, for example, a hydraulic cylinder, a uniaxially stage, or a motor. The movement mechanism 82 is controlled by the control unit 7.

The ultraviolet irradiator 2 emits ultraviolet light. The ultraviolet irradiator 2 is, for example, an excimer UV lamp. The ultraviolet irradiator 2 has, for example, a bar shape, and is disposed in such a posture that a longitudinal direction thereof is aligned with the Y direction. The length of the ultraviolet irradiator 2 in the Y direction is longer than the diameter of the substrate W1, and the width of the ultraviolet irradiator 2 in the X direction is shorter than the radius of the substrate W1.

The movement mechanism 22 moves the ultraviolet irradiator 2 above the substrate W1 along the main surface of the substrate W1 (in the X direction in FIG. 16). Specifically, the movement mechanism 22 moves the ultraviolet irradiator 2 toward the substrate W1 in the X direction from an initial position (FIGS. 16 and 17) shifted from the substrate W1 in the X direction. Then, the movement mechanism 22 moves the ultraviolet irradiator 2 from one end of the substrate W1 in the X direction to at least the center of the substrate W1. The movement mechanism 22 is, for example, a hydraulic cylinder, a uniaxially stage, or a motor. The movement mechanism 22 is controlled by the control unit 7.

In FIG. 16, the measurement unit 80 and the ultraviolet irradiator 2 are disposed at an identical position in the Z direction. Thus, the control unit 7 controls the movement mechanisms 22 and 82 while avoiding interference between the measurement unit 80 and the ultraviolet irradiator 2.

Figure 20:
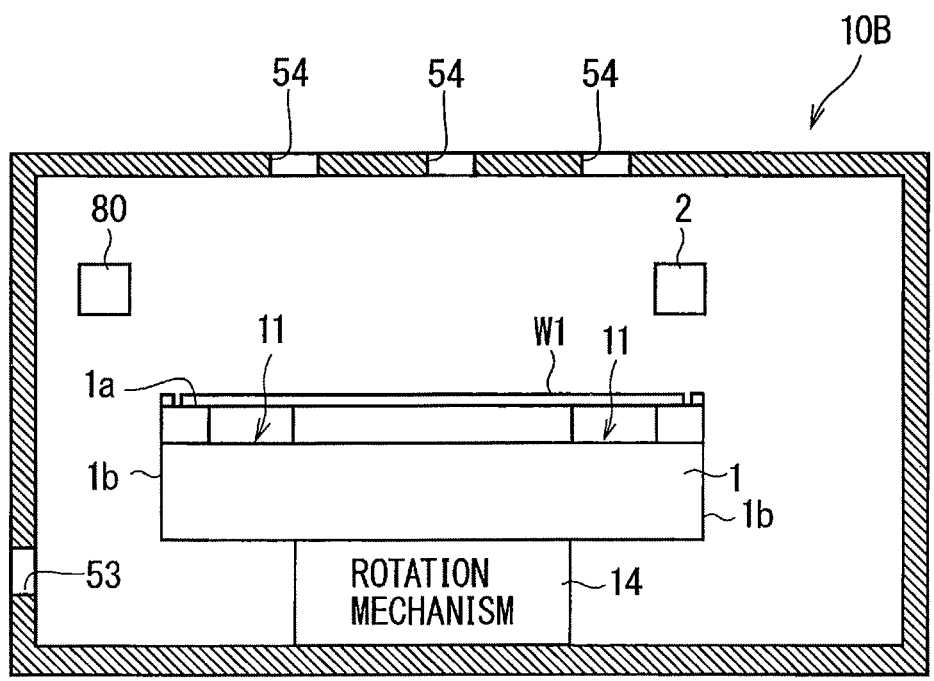
FIG. 20 is a diagram schematically illustrating an exemplary static eliminator.
Figure 21:
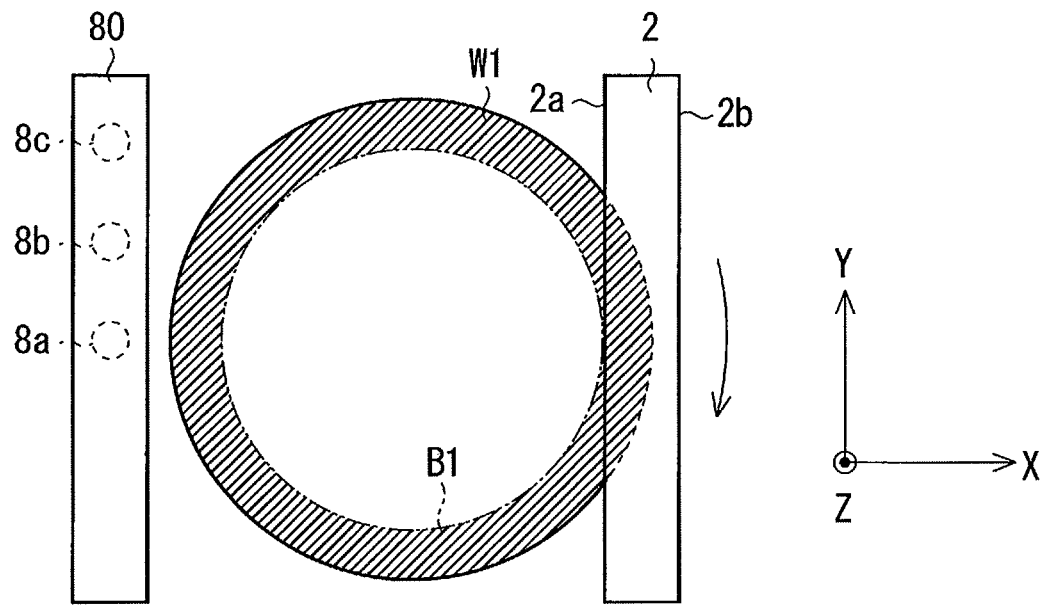
FIG. 21 is a diagram schematically illustrating an example of the substrate, the exemplary ultraviolet irradiator, and the measurement unit.
Figure 22:
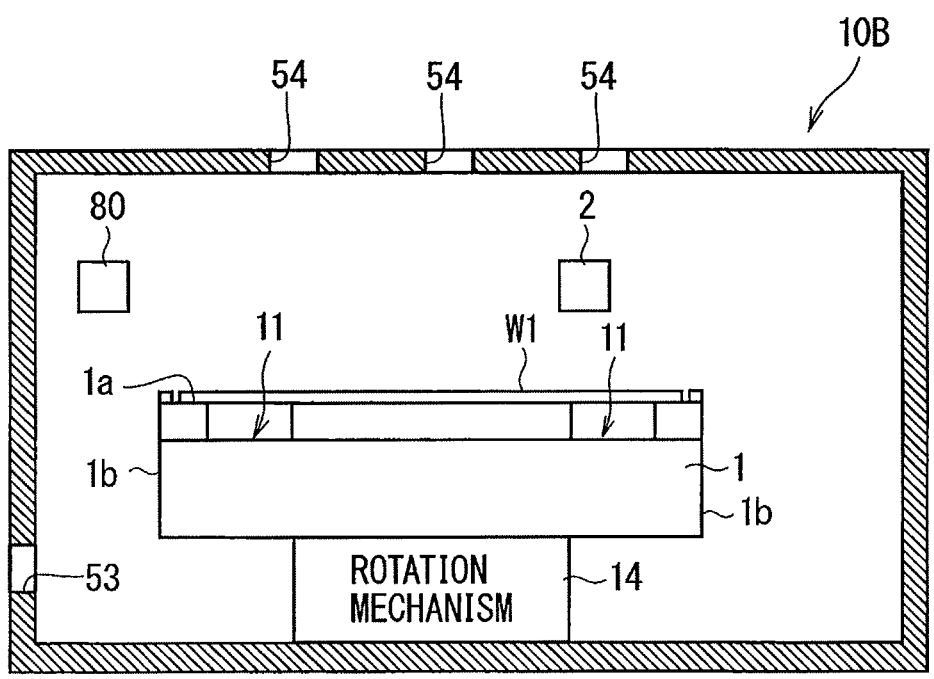
FIG. 22 is a diagram schematically illustrating an exemplary static eliminator.
Figure 23:
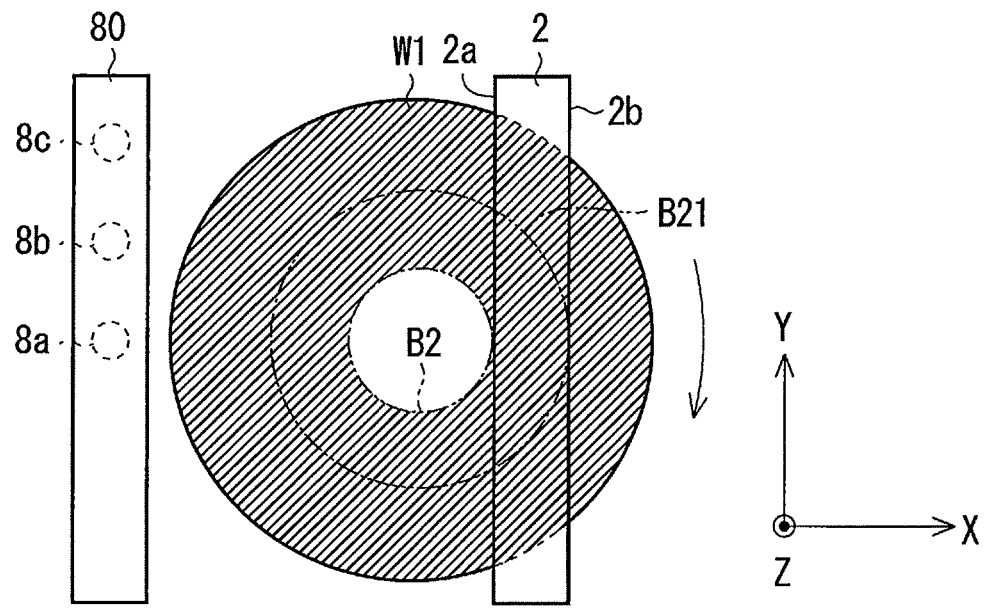
FIG. 23 is a diagram schematically illustrating an example of the substrate, the ultraviolet irradiator, and the measurement unit.
Figure 24:
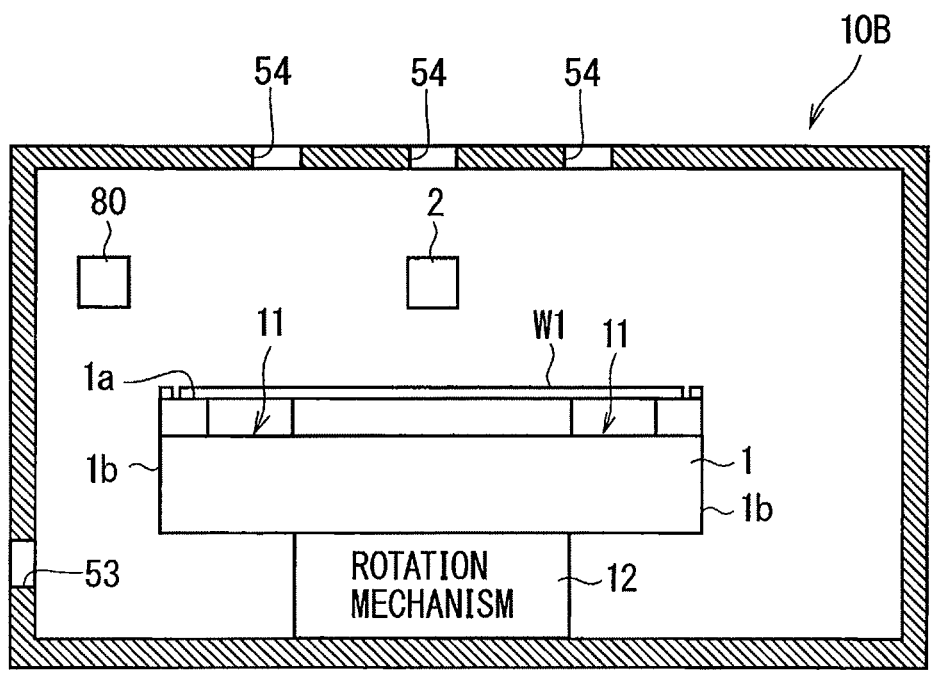
FIG. 24 is a diagram schematically illustrating an exemplary static eliminator.
Figure 25:
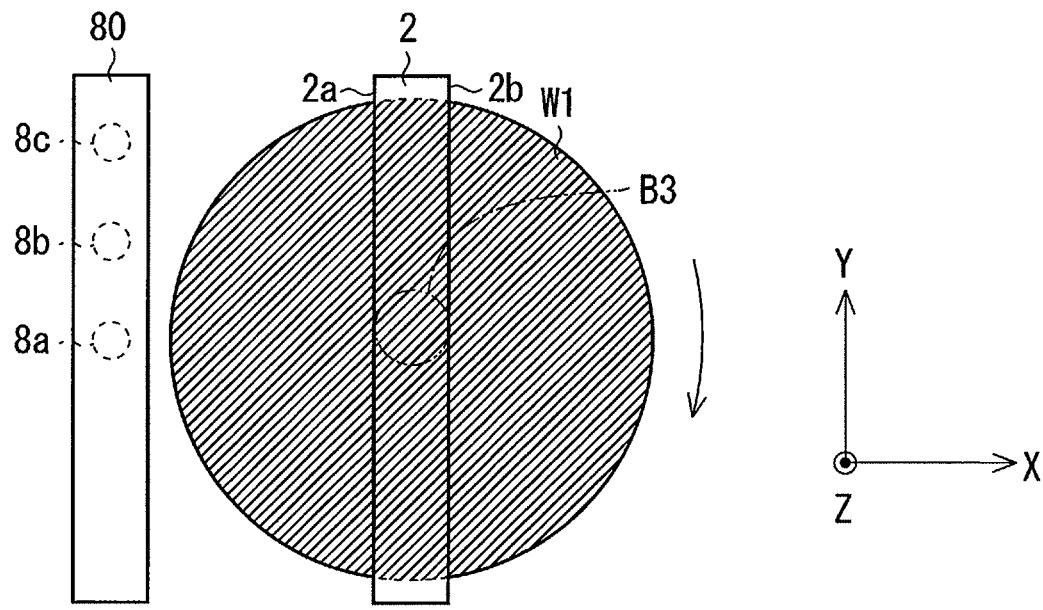
FIG. 25 is a diagram schematically illustrating an example of the substrate, the ultraviolet irradiator, and the measurement unit.

Similarly to the first preferred embodiment, the rotation mechanism 14 rotates the substrate holder 1 and thus the substrate W1. While controlling the rotation mechanism 14 to rotate the substrate W1, the control unit 7 controls the ultraviolet irradiator 2 to emit ultraviolet light and moves the ultraviolet irradiator 2 from the one end of the substrate W1 in the X direction to at least the center thereof. FIGS. 20 to 25 schematically illustrate an example in which the ultraviolet irradiator 2 is moved. FIGS. 20, 22, and 24 schematically illustrate an exemplary configuration of the static eliminator 10B, and FIGS. 21, 23, and 25 schematically illustrate an exemplary configuration of the substrate W1, the ultraviolet irradiator 2, and the measurement unit 80.

In FIGS. 20 and 21, the ultraviolet irradiator 2 is positioned near an end of the substrate W1 in the X direction. In this case, a region inside of a virtual circle B1 on the substrate W1 is not irradiated with ultraviolet light, but a region outside of the virtual circle B1 is irradiated with ultraviolet light. The virtual circle B1 is concentric with the substrate W1 and touches a first surface 2a of the ultraviolet irradiator 2, which is closer to the center of the substrate W1. Any part closer to the periphery of the substrate W1 moves directly below the ultraviolet irradiator 2 over a longer distance through one rotation of the substrate W1. Thus, the part closer to the periphery of the substrate W1 is irradiated for a longer time. As a result, the part closer to the periphery of the substrate W1 is irradiated with a larger amount (irradiation amount per one rotation) of ultraviolet light.

In FIGS. 22 and 23, the ultraviolet irradiator 2 is positioned between the center and periphery of the substrate W1 in the X direction. In this case, a region inside of a virtual circle B2 on the substrate W1 is not irradiated with ultraviolet light, but a region outside of the virtual circle B2 is irradiated with ultraviolet light. The virtual circle B2 is concentric with the substrate W1 and touches the first surface 2a of the ultraviolet irradiator 2. Since the ultraviolet irradiator 2 is positioned close to the center of the substrate W1 as compared to the state illustrated in FIG. 21, the diameter of the virtual circle B2 is smaller than that of the virtual circle B1. In other words, a larger region can be irradiated with ultraviolet light.

Consider a virtual circle B21. The virtual circle B21 is concentric with the substrate W1 and touches a second surface 2b of the ultraviolet irradiator 2, which is closer to the periphery of the substrate W1. Any point on the virtual circle B21 moves directly below the ultraviolet irradiator 2 over the longest distance through rotation of the substrate W1. Thus, any part closer to the virtual circle B21 is irradiated with ultraviolet light for a longer time. As a result, the part closer to the virtual circle B21 is irradiated with a larger amount (irradiation amount per one rotation) of ultraviolet light. In this manner, a region with a large irradiation amount per one rotation moves closer to the center of the substrate W1 as the ultraviolet irradiator 2 moves closer to the center of the substrate W1.

In FIGS. 24 and 25, the ultraviolet irradiator 2 is positioned at the center of the substrate W1. In this case, the entire range of the substrate W1 is irradiated with ultraviolet light. Consider a virtual circle B3. The virtual circle B3 is concentric with the substrate W1 and touches the first surface 2a and the second surface 2b of the ultraviolet irradiator 2. A region inside of the virtual circle B3 is constantly irradiated with ultraviolet light, and thus, the irradiation amount per one rotation in this region is larger than that in any other region.

As described above, a region with a large irradiation amount per one rotation moves as the ultraviolet irradiator 2 moves.

The control unit 7 can control a speed at which the ultraviolet irradiator 2 is moved by the movement mechanism 22. In this manner, the irradiation amount of ultraviolet light with which the substrate W1 is irradiated can be controlled. For example, the control unit 7 reduces the moving speed to allow the ultraviolet irradiator 2 to stay above the substrate W1 for a longer time. Accordingly, the substrate W1c an be irradiated with an increased amount of ultraviolet light. In addition, the control unit 7 increases the moving speed to allow the substrate W1 to be irradiated with a reduced amount of ultraviolet light.

The control unit 7 controls the moving speed in accordance with the position of the ultraviolet irradiator 2 relative to the substrate W1. Thus, the control unit 7 functions as a speed controller configured to control the pattern of the moving speed (the pattern of change of the moving speed in accordance with the position). In other words, the control unit 7 controls, through the moving speed, the irradiation amount at each position relative to the substrate W1. For example, the control unit 7 can perform such control that the moving speed when the ultraviolet irradiator 2 positioned near the end of the substrate W1 in the X direction (FIGS. 20 and 21) is lower than the moving speed when the ultraviolet irradiator 2 is positioned near the center of the substrate W1 (FIGS. 24 and 25). This control allows the ultraviolet irradiator 2 to stay near the periphery of the substrate W1 for a longer time. Thus, a region near the periphery of the substrate W1 can be irradiated for an increased time. As result, the region near the periphery can be irradiated with an increased amount of ultraviolet light.

The control unit 7 controls the pattern of the moving speed of the ultraviolet irradiator 2 based on the surface potentials Va to Vc measured by the surface potential meters 8a to 8c before ultraviolet irradiation. Specifically, the control unit 7 determines, based on the surface potentials Va to Vc before ultraviolet irradiation, the necessary irradiation amount of ultraviolet light necessary for removing electric charge at each position on the substrate W1, and then determines the moving speed at each position of the ultraviolet irradiator 2 to achieve irradiation with the determined irradiation amount of ultraviolet light at the position on the substrate W1. The relation between each of the surface potentials Va to Vc and the necessary irradiation amount at each position is, for example, set in advance and stored in the storage unit of the control unit 7 or the like.

Figure 26:
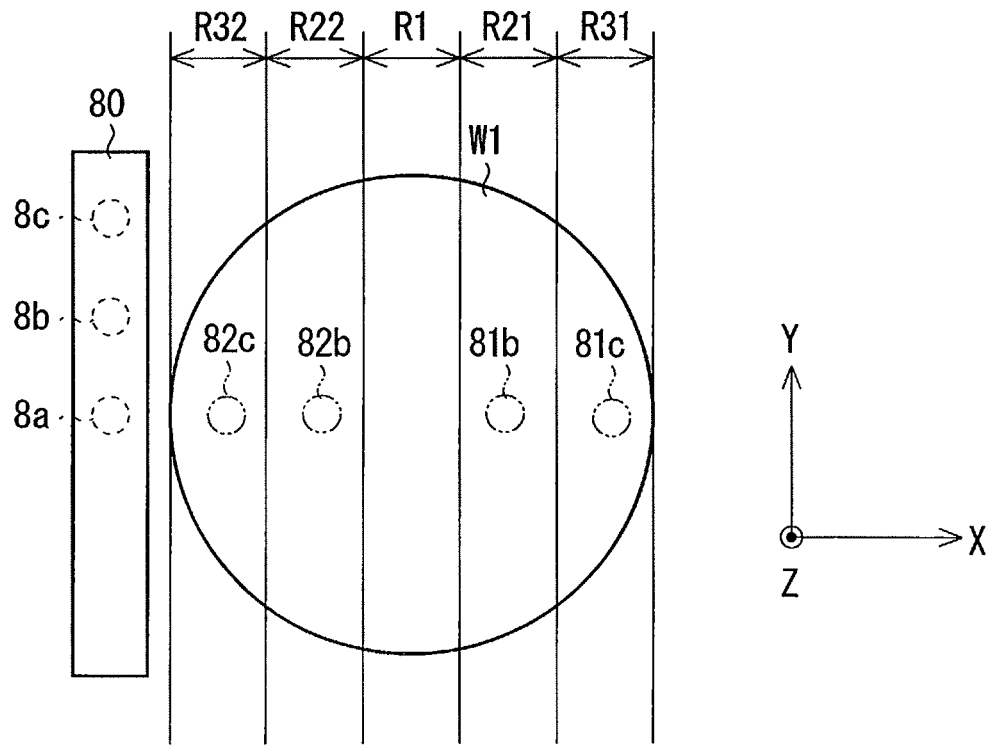
FIG. 26 is a diagram schematically illustrating an example of the substrate and the measurement unit.

A plurality of regions are set for the position of the ultraviolet irradiator 2. FIG. 26 is a diagram illustrating these regions. In the example illustrated in FIG. 26, regions R1, R21, R22, R31, and R32 are provided. These regions each extend in the Y direction and are disposed adjacent to each other in the X direction. The region R1 includes the center of the substrate W1, and the center of the region R1 in the X direction coincides with the center of the substrate W1. The region R31 is positioned at one edge of the substrate W1 in the X direction, and the region R32 is positioned at the other edge of the substrate W1 in the X direction. The region R21 is positioned between the regions R1 and R31, and the region R22 is positioned between the regions R1 and R32. The widths of the regions R1, R21, R22, R31, and R32 in the X direction are set to be equal to each other.

In the following, the ultraviolet irradiator 2 is defined to be positioned in the region R1 when the center of the ultraviolet irradiator 2 in the X direction is positioned in the region R1. This also applies to the regions R21, R22, R31, and R32.

The following describes the relation between the regions R1, R21, R22, R31, and R32 and the surface potential meters 8a to 8c. The surface potential meter 8a is disposed at a position facing to the center of the substrate W1 while the measurement unit 80 is stopping at the measurement position (FIG. 19). This position is included in the region R1.

The surface potential meter 8b is provided at a position corresponding to the regions R21 and R22. Specifically, the regions R21 and R22 include parts 81b and 82b, respectively, to which a measurement target part of the surface potential meter 8b is rotated about the center of the substrate W1 by ±90° while the measurement unit 80 is stopping at the measurement position. The symmetric property of surface potential allows an assumption that the surface potential is substantially constant in the circumferential direction. Thus, it can be thought that the surface potential meter 8b measures the surface potential at the parts 81b and 82b in the regions R21 and R22.

The surface potential meter 8c is provided at a position corresponding to the regions R31 and R32. Specifically, the regions R31 and R32 include parts 81c and 82c, respectively, to which a measurement target part of the surface potential meter 8c is rotated about the center of the substrate W1 by ±90° while the measurement unit 80 is stopping at the measurement position. The symmetric property of surface potential allows an assumption that the surface potential is substantially constant in the circumferential direction. Thus, it can be thought that the surface potential meter 8c measures the surface potential at the parts 81c and 82c in the regions R31 and R32.

The following describes an exemplary method of determining the moving speed. Consider a case in which the ultraviolet irradiator 2 moves from the region R31 to the region R1 and stops at the region R1. In this case, the control unit 7 determines the moving speed of the ultraviolet irradiator 2 in the regions R1, R21, and R31.

A region near the center of the substrate W1 is irradiated with ultraviolet light only when the ultraviolet irradiator 2 is positioned near the center of the substrate W1. As illustrated in, for example, FIGS. 21 and 23, when the ultraviolet irradiator 2 is far away from the center of the substrate W1, the region near the center of the substrate W1 is not irradiated with ultraviolet light. Thus, the ultraviolet irradiator 2 needs to achieve, during a first duration in which the ultraviolet irradiator 2 is positioned in the region R1, irradiation in the necessary irradiation amount required for static elimination near the center of the substrate W1.

To achieve this, the control unit 7 determines the moving speed in the region R1 based on the surface potential Va at the center of the substrate W1. Specifically, the control unit 7 determines, based on the surface potential Va, a necessary irradiation amount Ua required for static elimination near the center of the substrate W1, and then determines the moving speed in the region R1 so that irradiation in the necessary irradiation amount Ua can be achieved in the first duration. The relation between each of the surface potential Va to Vc and the necessary irradiation amount for the corresponding region is set in advance by, for example, experiment or simulation as described above.

When the ultraviolet irradiator 2 is positioned at the region R21, a ring region including the measurement target part of the surface potential meter 8b can be irradiated with a larger irradiation amount (irradiation amount per one rotation) of ultraviolet light (refer to FIG. 23). This leads to simple expectation that this ring region is statically eliminated mainly during a second duration in which the ultraviolet irradiator 2 is positioned in the region R21.

Thus, the control unit 7 determines, based on the surface potential Vb, a necessary irradiation amount Ub required for static elimination of the ring region, and then determines the moving speed in the region R21 so that irradiation in the necessary irradiation amount Ub is achieved in the second duration.

Alternatively, the moving speed in the region R21 may be determined with taken into account the irradiation amount of ultraviolet light with which the ring region is irradiated when the ultraviolet irradiator 2 is positioned in the region R1. The ring region is irradiated in a larger irradiation amount through the first duration as the moving speed in the region R1 is lower. The moving speed in the region R1 is lower as the surface potential Va is higher. Accordingly, the ring region is irradiated in a larger irradiation amount through the first duration as the surface potential Va is higher. In other words, irradiation needs to be performed in a smaller irradiation amount through the second duration as the surface potential Va is higher.

Thus, the control unit 7 may determine the moving speed in the region R21 based on the surface potentials Va and Vb. Specifically, the control unit 7 may perform correction to set the moving speed in the region R21 to be lower as the surface potential Vb is higher, and correction to set the moving speed in the region R21 to be higher as the surface potential Va is higher.

When the ultraviolet irradiator 2 is positioned in the region R31, a peripheral region including the measurement target part of the surface potential meter 8c can be irradiated with a larger irradiation amount (irradiation amount per one rotation) of ultraviolet light (refer to FIG. 25). This leads to simple expectation that this peripheral region is statically eliminated mainly during a third duration in which the ultraviolet irradiator 2 is positioned in the region R31.

Thus, the control unit 7 determines, based on the surface potential Vc, a necessary irradiation amount Uc required for static elimination of the peripheral region, and then determines the moving speed in the region R31 so that irradiation in the necessary irradiation amount Uc is achieved.

Alternatively, the moving speed in the region R31 may be determined with taken into account the irradiation amount of ultraviolet light with which the peripheral region is irradiated when the ultraviolet irradiator 2 is positioned in each of the regions R1 and R21. The peripheral region is irradiated in a larger irradiation amount through the first and second durations as the moving speed in the regions R1 and R21 is lower. The moving speed in the regions R1 and R21 is lower as the respective surface potentials Va and Vb are higher. Accordingly, the peripheral region is irradiated in a larger irradiation amount through the first and second durations as the respective surface potentials Va and Vb are higher. In other words, irradiation needs to be performed in a smaller irradiation amount through the third duration as the surface potential Va is higher, and irradiation needs to be performed in a smaller irradiation amount through the third duration as the surface potential Vb is higher.

Thus, the control unit 7 may determine the moving speed in the region R31 based on the surface potentials Va to Vc. Specifically, the control unit 7 may perform correction to set the moving speed in the region R31 to be lower as the surface potential Vc is higher, and correction to set the moving speed in the region R31 to be higher as the surface potentials Va and Vb are higher.

Figure 27:
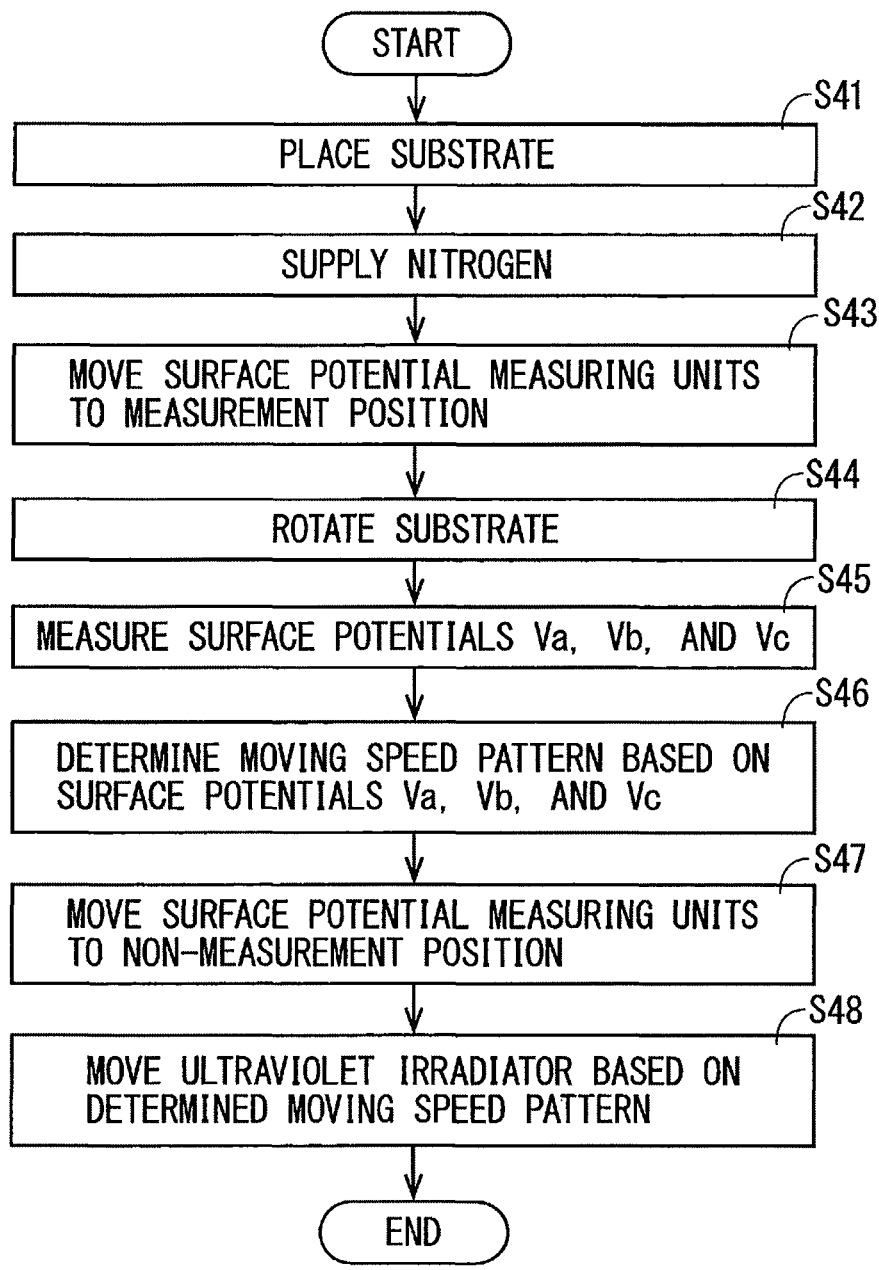
FIG. 27 is a flowchart illustrating an exemplary operation of the static eliminator.

FIG. 27 is a flowchart illustrating an exemplary operation of the static eliminator 10B. The ultraviolet irradiator 2 and the measurement unit 80 are initially positioned on the same side of the substrate W1. Steps S41 and S42 are identical to steps S1 and S2, respectively. Following at step S43, the control unit 7 controls the movement mechanism 82 to move the measurement unit 80 to the measurement position at step S42 (FIG. 19). Subsequently at step S44, the control unit 7 controls the rotation mechanism 14 to rotate the substrate holder 1 and thus the substrate W1. Subsequently at step S45, the surface potential meters 8a to 8c measure the surface potentials Va to Vc, respectively. At step S45, the control unit 7 may measure the surface potentials Va to Vc at a plurality of timings as the substrate W1 rotates, and employ, as the surface potentials Va to Vc, statistical values (for example, an average value) of the measured values.

Subsequently at step S46, the control unit 7 determines the pattern of the moving speed of the ultraviolet irradiator 2 based on the measured surface potentials Va to Vc. The pattern of the moving speed indicates the relation between the position and moving speed of the ultraviolet irradiator 2. For example, the control unit 7 determines the moving speed in the regions R1, R21, and R31.

Subsequently at step S47, the control unit 7 moves the measurement unit 80 to the non-measurement position. Specifically, the control unit 7 moves the measurement unit 80 to a side opposite the ultraviolet irradiator 2 in the X direction, and stops the measurement unit 80 at the non-measurement position not facing to the substrate W1. This prevents the ultraviolet irradiator 2 from colliding with the measurement unit 80 when moved. Steps S46 and S47 may be executed in the opposite order or in parallel.

Subsequently at step S48, the control unit 7 moves the ultraviolet irradiator 2 in the determined pattern of the moving speed. Accordingly, the main surface of the substrate W1 is irradiated with ultraviolet light from the ultraviolet irradiator 2 as appropriate. The irradiation is performed with ultraviolet light in an irradiation amount suitable for each position on the substrate W1. This can reduce or prevent reversed-polarity electric charge accumulation attributable to excessive ultraviolet irradiation.

In the above-described example, under control of the control unit 7, the movement mechanism 22 moves the ultraviolet irradiator 2 from an edge of the substrate W1 to the center thereof, but may move the ultraviolet irradiator 2 from an edge of the substrate W1 to the other edge thereof. Specifically, the ultraviolet irradiator 2 may be moved through the regions R31, R21, R1, R22, and R32 in this order to irradiate the main surface of the substrate W1 with ultraviolet light.

In the second preferred embodiment, the surface potential may be measured during ultraviolet irradiation. For example, a single surface potential meter 8 may be disposed at a position between the ultraviolet irradiator 2 and the substrate W1, facing to the center of the substrate W1 in the Y direction. The positional relation the ultraviolet irradiator 2 and the surface potential meter 8 may be fixed so that the ultraviolet irradiator 2 and the surface potential meter 8 are integrally moved. Alternatively, the surface potential meter 8 may be provided at a position adjacent to the ultraviolet irradiator 2 in the X direction, and moved integrally with the ultraviolet irradiator 2. The control unit 7 may move the ultraviolet irradiator 2 in the X direction based on a surface potential measured during ultraviolet irradiation.

<Surface Potential Meter 8>

Any surface potential meter 8 does not necessarily need to be provided to the static eliminator 10. The surface potential meter 8 may be provided outside of the static eliminator 10 to measure the surface potential at the substrate W1. The control unit 7 may acquire this information on the surface potential through, for example, communication.

<Movement Mechanism>

The movement mechanisms 22 and 82 each move the ultraviolet irradiator 2 and the measurement unit 80, but the present invention is not limited thereto. For example, one movement mechanism may be provided to move the substrate holder 1 in the X direction. With this configuration, too, the substrate holder 1 and each of the ultraviolet irradiator 2 and the measurement unit 80 can be relatively moved in the X direction.

While the invention has been shown and described in detail, the foregoing description is in all aspects illustrative and not restrictive. It is therefore understood that numerous modifications and variations can be devised without departing from the scope of the invention.

What is claimed is:

1. A static eliminator configured to perform processing of reducing a charge amount of an electrically charged substrate, the static eliminator comprising:
    a substrate holder configured to hold the electrically charged substrate;
    an ultraviolet irradiator configured to irradiate a plurality of divided regions of a main surface of the electrically charged substrate with ultraviolet light in an irradiation amount that mutually differs between the plurality of regions of the electrically charged substrate and is in accordance with the plurality of regions, the irradiation amount of ultraviolet light from the ultraviolet irradiator to the plurality of regions being variable;
    a plurality of surface potential meters configured to measure surface potentials in the plurality of respective regions at the main surface of the electrically charged substrate; and
    an irradiation amount controller configured to control the irradiation amount in the plurality of respective regions in accordance with the surface potentials measured by the plurality of surface potential meters.

2. The static eliminator according to claim 1, wherein
    the ultraviolet irradiator includes a plurality of unit irradiators, and
    the plurality of unit irradiators irradiate the plurality of respective regions with ultraviolet light.

3. The static eliminator according to claim 1, further comprising an ultraviolet controller configured to control the ultraviolet irradiator, wherein
    the ultraviolet irradiator includes a plurality of unit irradiators,
    the plurality of unit irradiators irradiate the plurality of respective regions with ultraviolet light,
    the plurality of surface potential meters measure the surface potentials at the main surface of the electrically charged substrate during the ultraviolet irradiation by the ultraviolet irradiator,
    the ultraviolet controller:
    determines whether an absolute value of the surface potential in one of the plurality of regions measured by one of the plurality of surface potential meters is smaller than a reference value; and
    stops a unit irradiator corresponding to the one of the plurality of regions among the plurality of unit irradiators, when having determined that the absolute value of the surface potential in the one of the plurality of regions is smaller than the reference value.

4. The static eliminator according to claim 2, wherein the plurality of unit irradiators have arc or ring shapes having mutually different radii and are concentrically arranged.

5. The static eliminator according to claim 2, further comprising a rotation mechanism configured to rotate the substrate holder about a rotational axis orthogonal to the main surface of the electrically charged substrate, wherein the plurality of unit irradiators each have a bar shape extending in a first direction parallel to the main surface of the electrically charged substrate and are arranged side by side in a second direction parallel to the main surface of the electrically charged substrate and orthogonal to the first direction.

6. The static eliminator according to claim 2, further comprising a switching controller configured to control the irradiation amount of ultraviolet light in each of the plurality of regions by performing switching between execution and stop of ultraviolet irradiation by each of the plurality of unit irradiators.

7. The static eliminator according to claim 2, further comprising an intensity controller configured to control the plurality of unit irradiators to control an intensity of ultraviolet light emitted by each of the plurality of unit irradiators.

8. The static eliminator according to claim 1, further comprising: a first movement mechanism configured to relatively move the ultraviolet irradiator and the substrate holder in a direction along the main surface of the electrically charged substrate; a rotation mechanism configured to rotate the substrate holder about a rotational axis orthogonal to the main surface of the electrically charged substrate; and
    a speed controller configured to control the first movement mechanism to control a pattern indicating a relation of a relative position between the ultraviolet irradiator and the substrate holder and a relative moving speed between the ultraviolet irradiator and the substrate holder based on the surface potentials measured by the plurality of surface potential meters.

9. The static eliminator according to claim 8, further comprising a second movement mechanism configured to relatively move the plurality of surface potential meters and the substrate holder between a position at which the plurality of surface potential meters face to the main surface of the electrically charged substrate and a position at which the plurality of surface potential meters do not face to the main surface of the electrically charged substrate.

10. A static eliminating method of reducing a charge amount of an electrically charged substrate, the method comprising:
 a first process of placing the electrically charged substrate on a substrate holder; and
 a second process of irradiating, by an ultraviolet irradiator, a plurality of divided regions of a main surface of the electrically charged substrate with ultraviolet light in an irradiation amount that mutually differs between the plurality of regions of the electrically charged substrate and is in accordance with the plurality of regions, the irradiation amount of ultraviolet light from the ultraviolet irradiator to the plurality of regions being variable, wherein
 the second process includes:
  a process of measuring surface potentials in the plurality of respective regions at the main surface of the electrically charged substrate by a plurality of surface potential meters; and
  a process of controlling the irradiation amount in the plurality of respective regions in accordance with the surface potentials measured by the plurality of surface potential meters.

11. The static eliminating method according to claim 10, wherein the second process includes:
 a process of starting irradiation of the plurality of regions with ultraviolet light by a plurality of respective unit irradiators included in the ultraviolet irradiator;
 a process of measuring, by the plurality of surface potential meters, the surface potentials at the main surface of the electrically charged substrate during the ultraviolet irradiation by the ultraviolet irradiator;
 a process of determining whether an absolute value of the surface potential in one of the plurality of regions measured by one of the plurality of surface potential meters is smaller than a reference value; and
 a process of stopping a unit irradiator corresponding to the one of the plurality of regions among the plurality of unit irradiators, when having determined that the absolute value of the surface potential in the one of the plurality of regions is smaller than the reference value.

12. The static eliminating method according to claim 10, wherein
 the ultraviolet irradiator includes a plurality of unit irradiators, and
 the plurality of unit irradiators irradiate the plurality of respective regions with ultraviolet light.

13. The static eliminating method according to claim 12, wherein
 the plurality of unit irradiators have arc or ring shapes having mutually different radii and are concentrically arranged.

14. The static eliminating method according to claim 12, wherein the plurality of unit irradiators each have a bar shape extending in a first direction parallel to the main surface of the electrically charged substrate and are arranged side by side in a second direction parallel to the main surface of the electrically charged substrate and orthogonal to the first direction, and
 in the second process, the substrate holder is rotated about a rotational axis orthogonal to the main surface of the electrically charged substrate.

15. The static eliminating method according to claim 12, wherein
 in the second process, the irradiation amount of ultraviolet light in each of the plurality of regions is controlled by performing switching between execution and stop of ultraviolet irradiation by each of the plurality of unit irradiators.

16. The static eliminating method according to claim 12, wherein
 in the second process, the plurality of unit irradiators are controlled to control an intensity of ultraviolet light emitted by each of the plurality of unit irradiators.

17. The static eliminating method according to claim 10, wherein the second process includes:
 a process of measuring, by the plurality of surface potential meters, the surface potentials at the main surface of the electrically charged substrate during the ultraviolet irradiation by the ultraviolet irradiator;
 a process of starting irradiation of the plurality of regions with ultraviolet light by a plurality of respective unit irradiators included in the ultraviolet irradiator; and
 a process of relatively moving the ultraviolet irradiator and the substrate holder in a direction along the main surface of the electrically charged substrate in a pattern of a moving speed controlled based on the surface potential measured by each of the plurality of surface potential meters while rotating the substrate holder about a rotational axis orthogonal to the main surface of the electrically charged substrate.

18. The static eliminating method according to claim 17, wherein the second process further includes
 a process of relatively moving the plurality of surface potential meters and the substrate holder between a position at which the plurality of surface potential meters face to the main surface of the electrically charged substrate and a position at which the plurality of surface potential meters do not face to the main surface of the electrically charged substrate.

* * * * *